US012080780B2

(12) United States Patent
Lin et al.

(10) Patent No.: US 12,080,780 B2
(45) Date of Patent: Sep. 3, 2024

(54) ISOLATION STRUCTURES IN MULTI-GATE SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Shih-Hao Lin, Hsinchu (TW); Chih-Chuan Yang, Hsinchu (TW); Hsin-Wen Su, Hsinchu (TW); Jing-Yi Lin, Hsinchu (TW); Shang-Rong Li, Hsinchu (TW); Chong-De Lien, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 422 days.

(21) Appl. No.: 17/460,620

(22) Filed: Aug. 30, 2021

(65) Prior Publication Data
US 2023/0067988 A1 Mar. 2, 2023

(51) Int. Cl.
*H01L 29/66* (2006.01)
*H01L 21/762* (2006.01)
*H01L 29/06* (2006.01)
*H01L 29/423* (2006.01)

(52) U.S. Cl.
CPC .. *H01L 29/66545* (2013.01); *H01L 21/76224* (2013.01); *H01L 29/0665* (2013.01); *H01L 29/42392* (2013.01); *H01L 29/66742* (2013.01)

(58) Field of Classification Search
CPC ......... H01L 29/66545; H01L 21/76224; H01L 29/0665; H01L 29/42392; H01L 29/66742; H01L 29/0673; H01L 29/66439; H01L 29/78696; H01L 29/165; H01L 29/7848; H01L 29/775; B82Y 10/00
USPC ....................................................... 257/401
See application file for complete search history.

(56) References Cited

U.S. PATENT DOCUMENTS

| | | | |
|---|---|---|---|
| 10,217,849 B2* | 2/2019 | Barraud | H01L 29/66439 |
| 2014/0312432 A1* | 10/2014 | Ching | H01L 29/785 257/288 |
| 2019/0123160 A1 | 4/2019 | Xie | |

(Continued)

FOREIGN PATENT DOCUMENTS

| | | | | |
|---|---|---|---|---|
| CN | 110690217 A | * | 1/2020 | ........... H01L 27/092 |
| CN | 112908853 A | | 6/2021 | |
| JP | 2013149826 A | * | 8/2013 | |

(Continued)

*Primary Examiner* — Mohammad M Hoque
(74) *Attorney, Agent, or Firm* — HAYNES AND BOONE, LLP

(57) ABSTRACT

A semiconductor structure includes a stack of semiconductor layers disposed over a protruding portion of a substrate, isolation features disposed over the substrate, wherein a top surface of the protruding portion of the substrate is separated from a bottom surface of the isolation features by a first distance, a metal gate stack interleaved with the stack of semiconductor layers, where a bottom portion of the metal gate stack is disposed on sidewalls of the protruding portion of the substrate and where thickness of the bottom portion of the metal gate stack is defined by a second distance that is less than the first distance, and epitaxial source/drain features disposed adjacent to the metal gate stack.

20 Claims, 17 Drawing Sheets

(56) References Cited

U.S. PATENT DOCUMENTS

2020/0075875 A1 3/2020 Vasen
2021/0066506 A1 3/2021 Liaw

FOREIGN PATENT DOCUMENTS

KR 20210047688 A * 4/2021
TW 202109636 A 3/2021

* cited by examiner

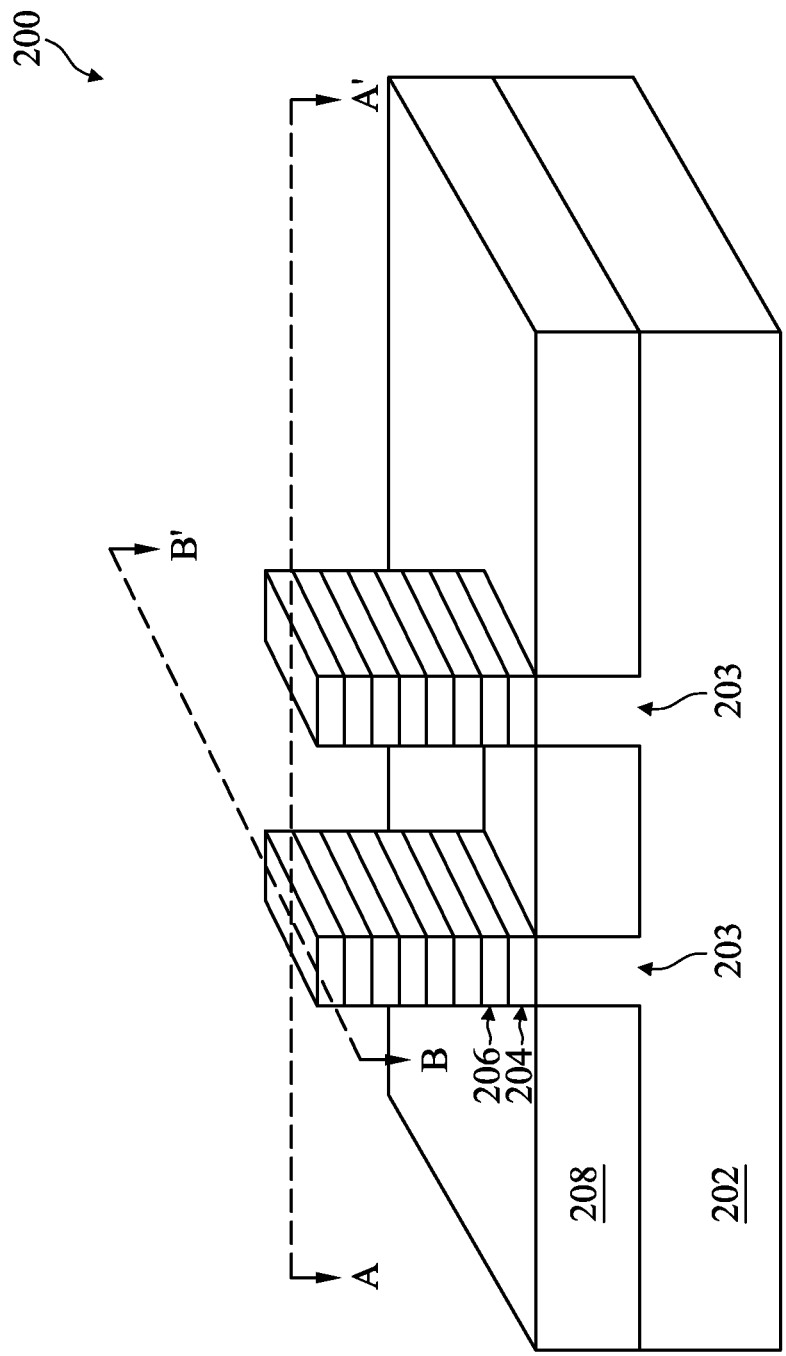
FIG. 2
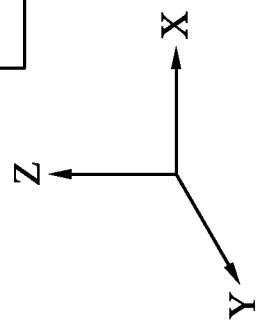

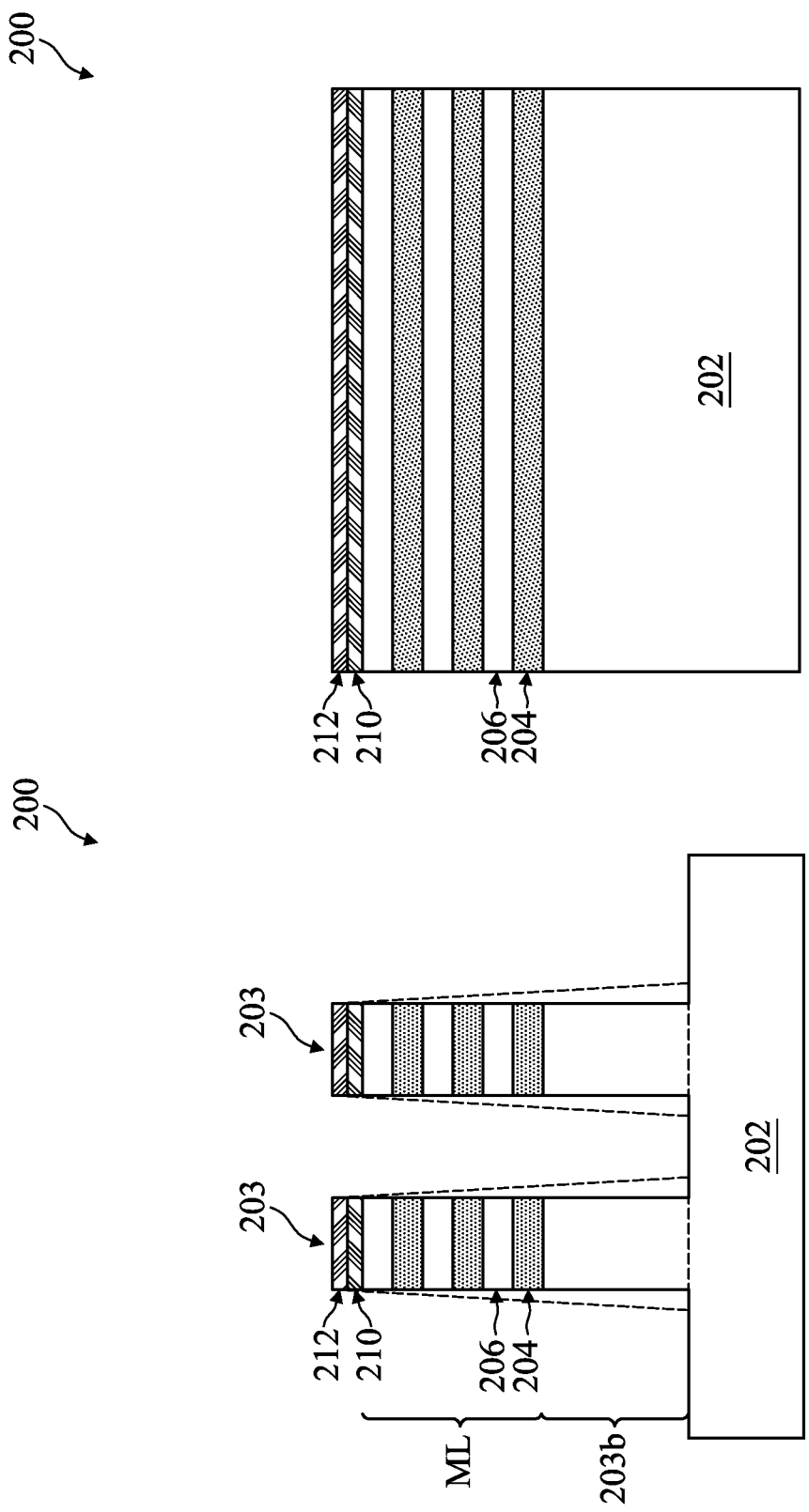
FIG. 4A
FIG. 4B

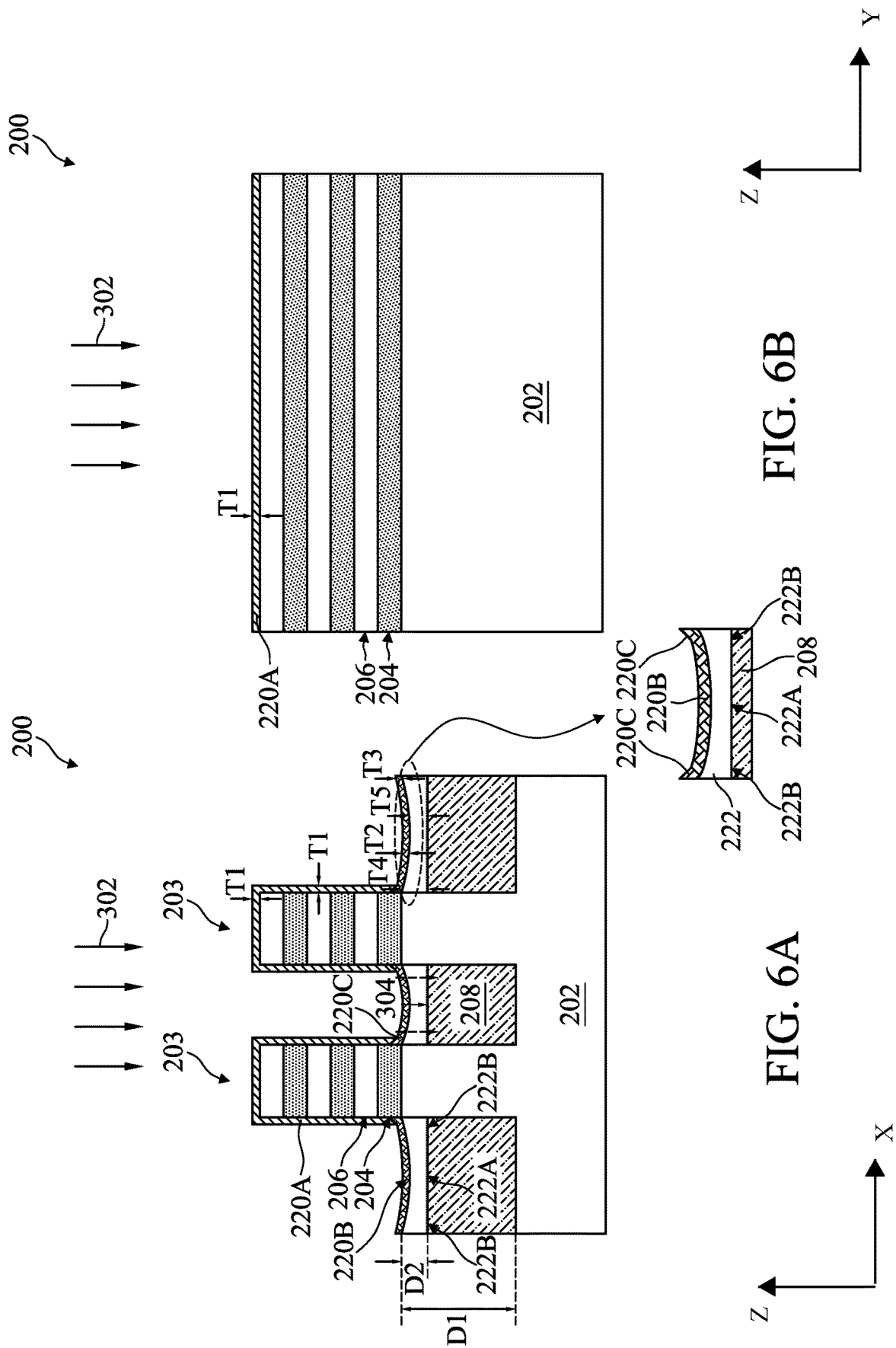

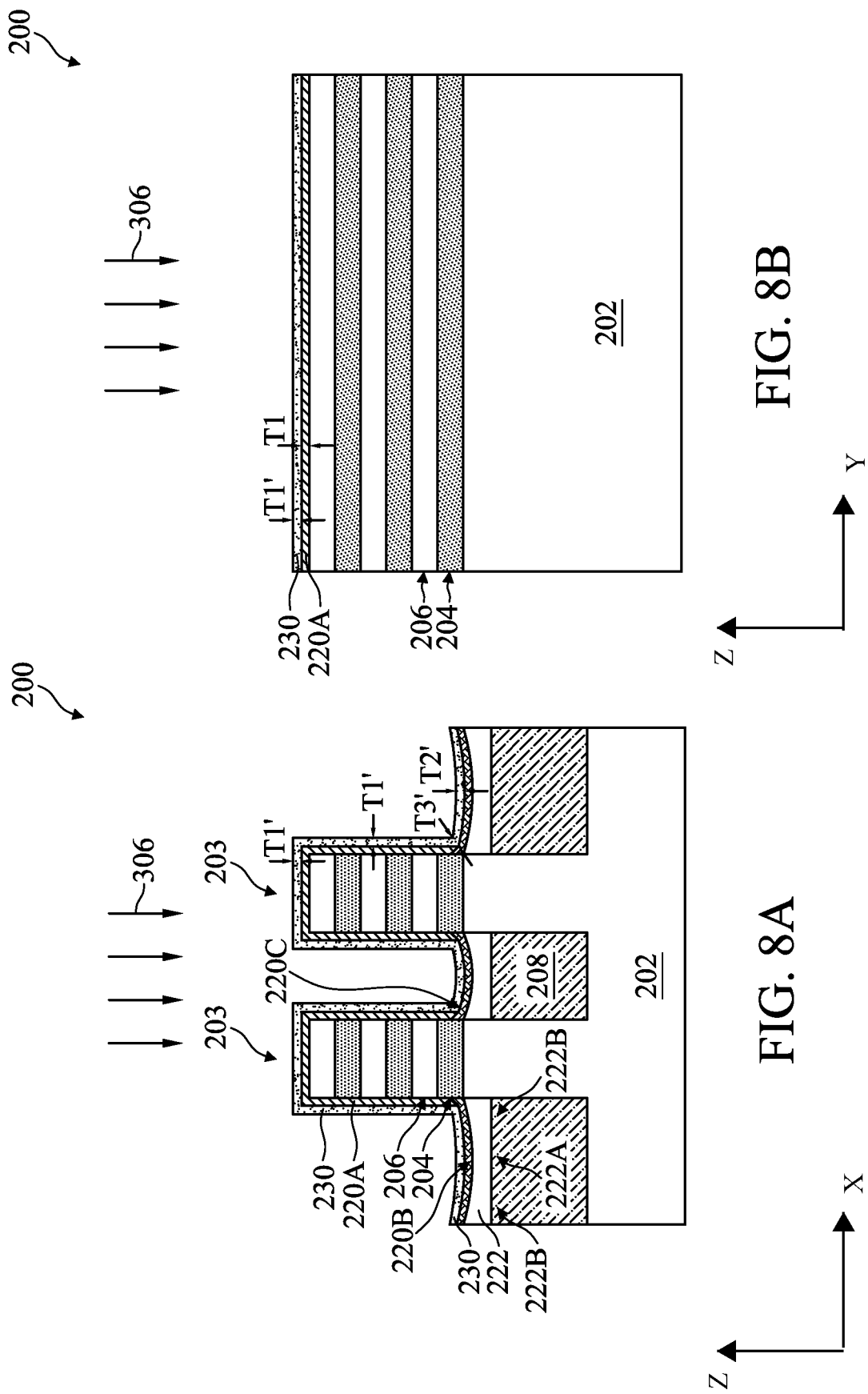

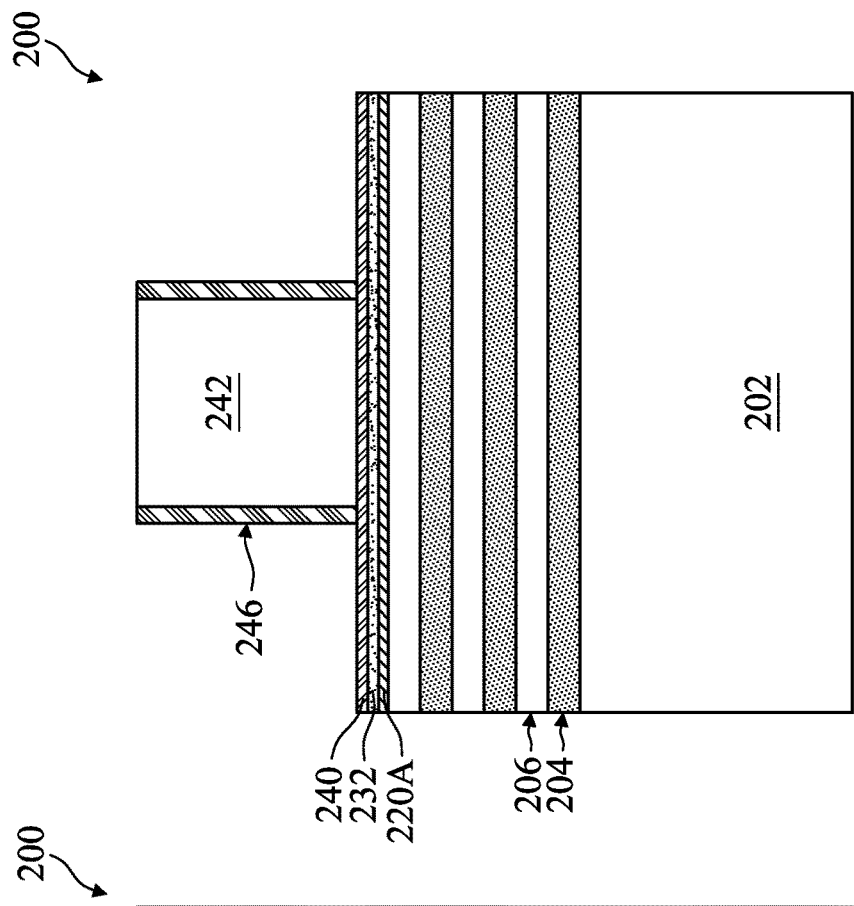
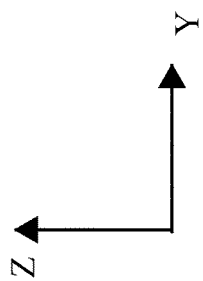
FIG. 10B
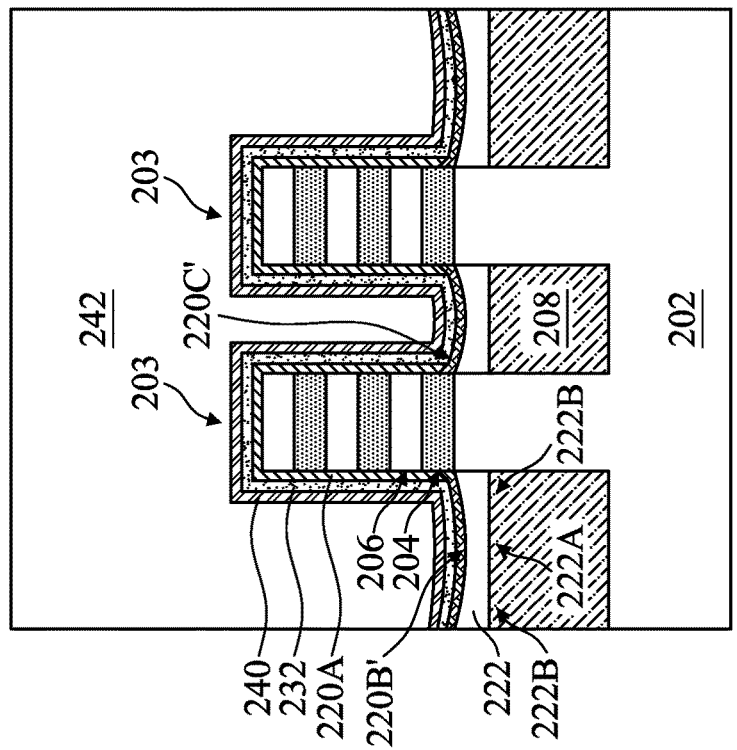
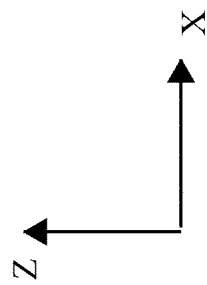
FIG. 10A

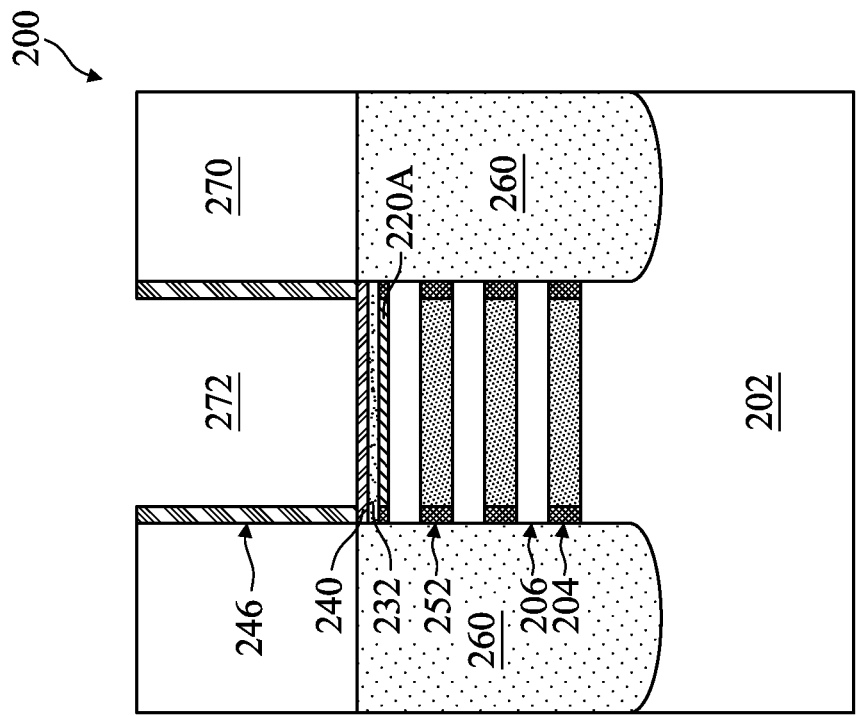
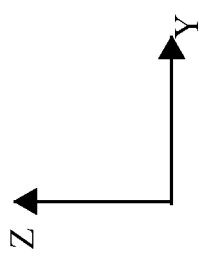
FIG. 13B
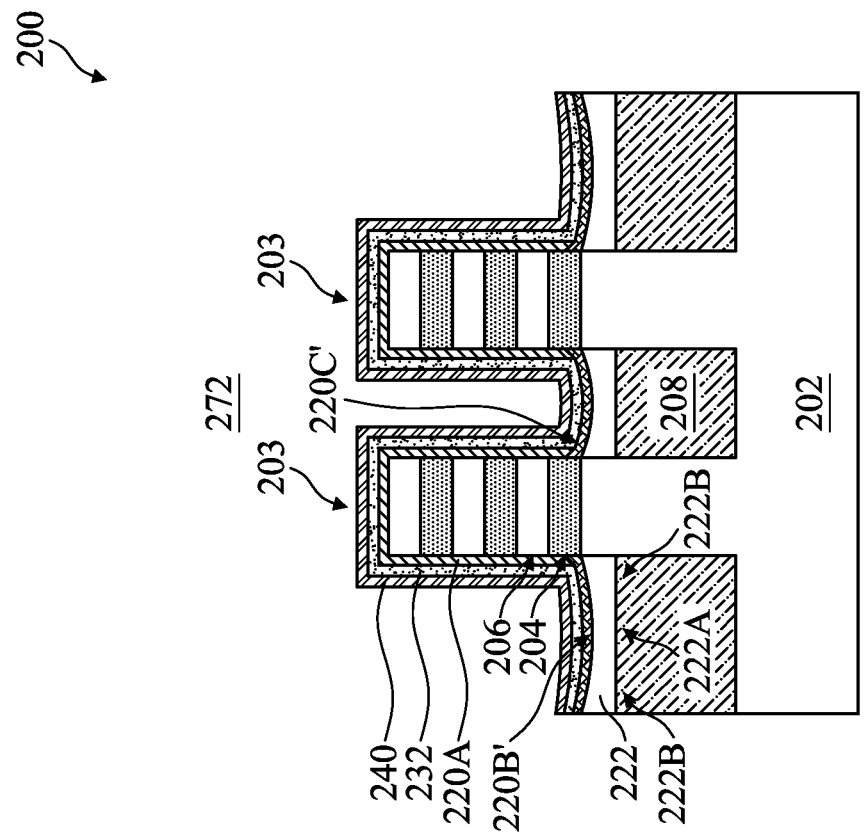
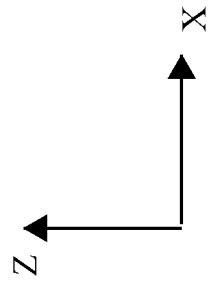
FIG. 13A

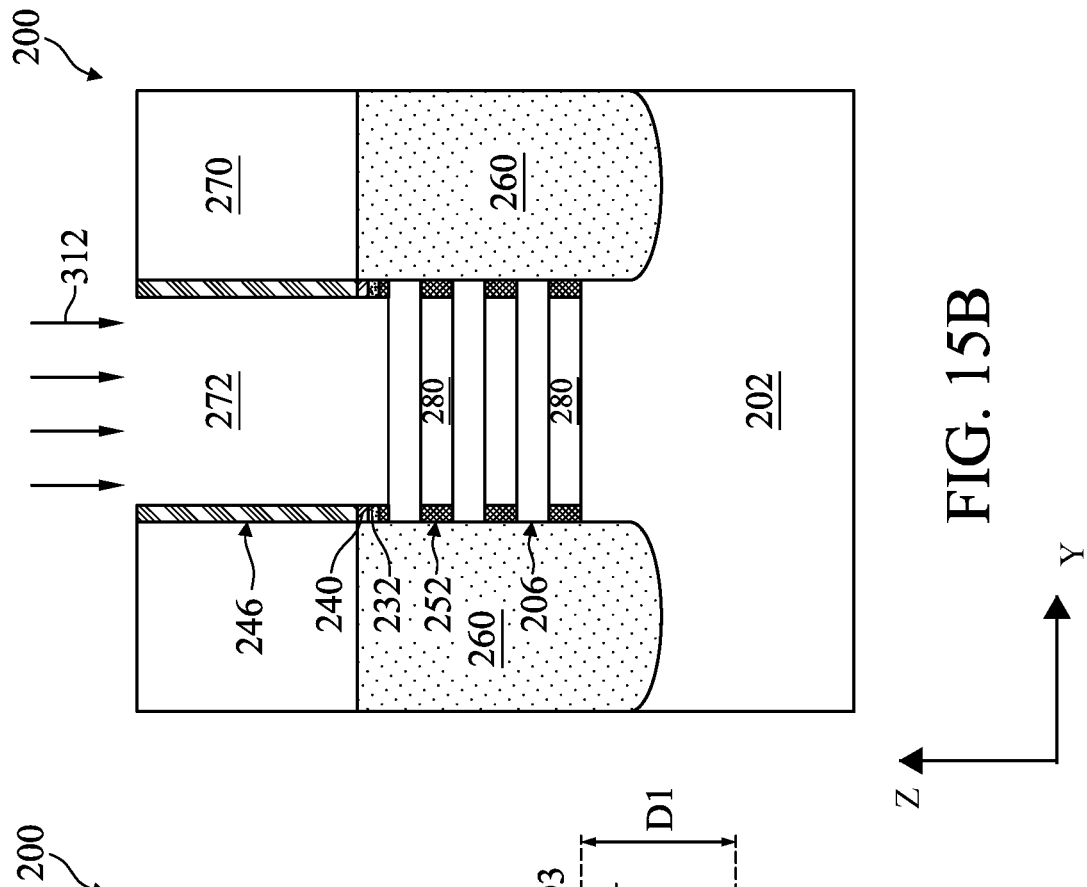
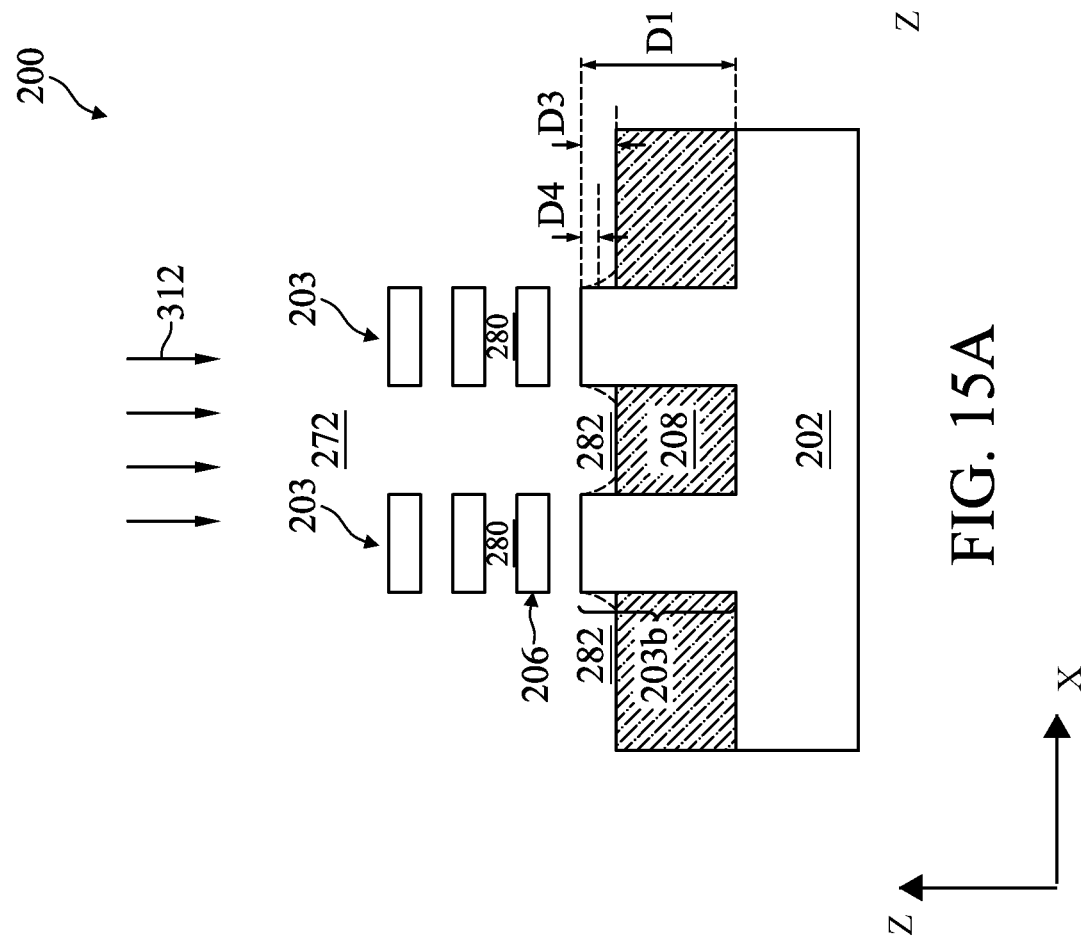
FIG. 15A
FIG. 15B

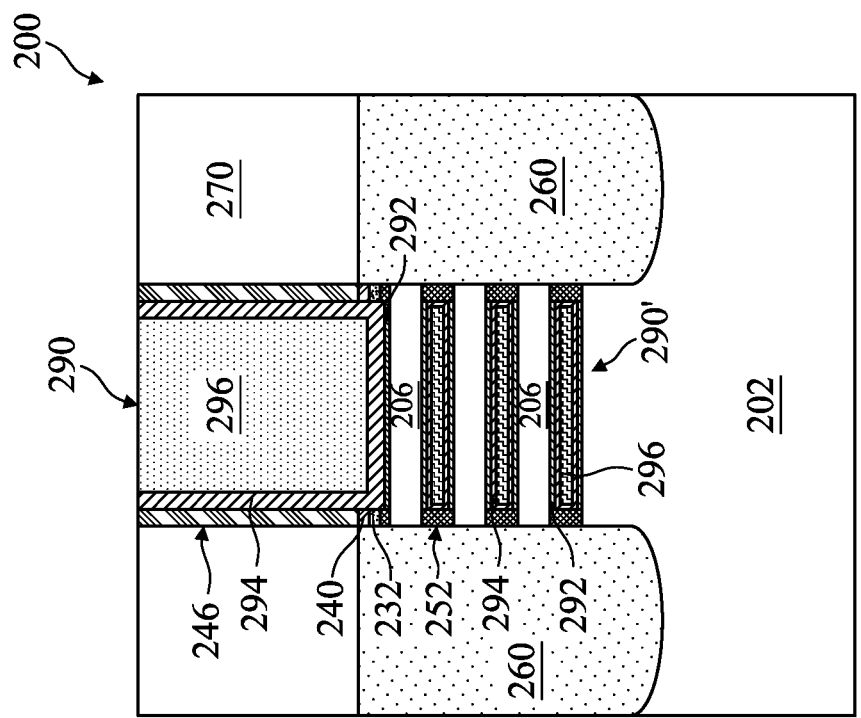
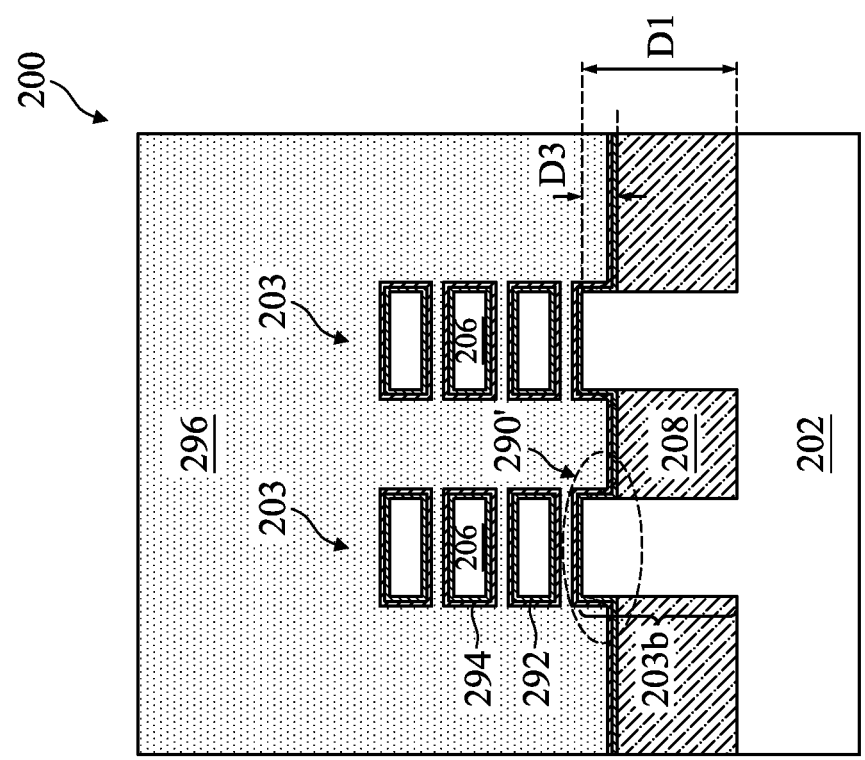
FIG. 16A
FIG. 16B

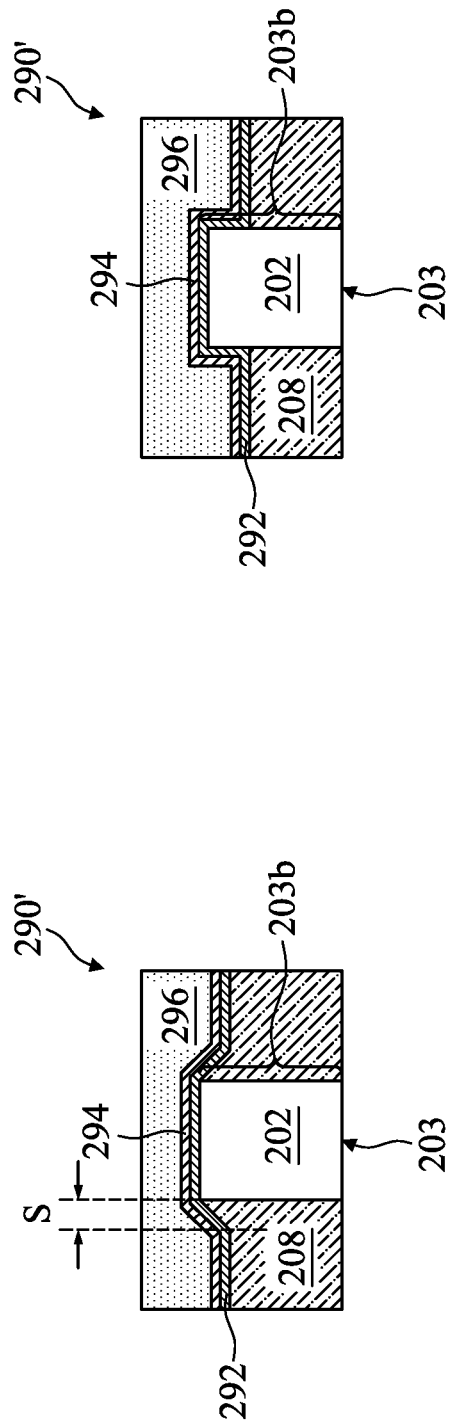
FIG. 17A
FIG. 17B
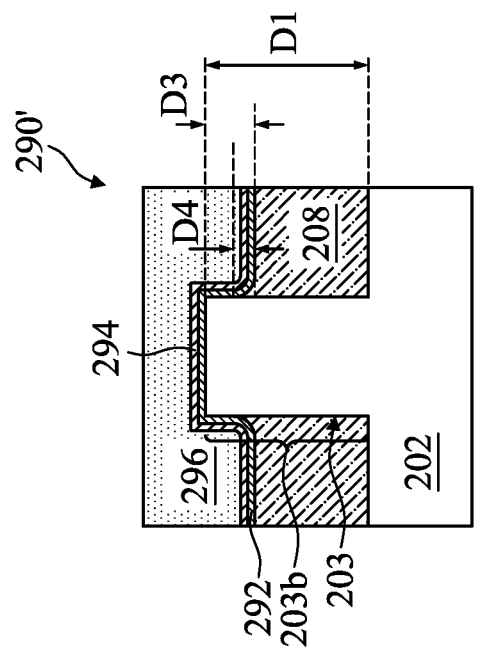
FIG. 17C

ISOLATION STRUCTURES IN MULTI-GATE SEMICONDUCTOR DEVICES AND METHODS OF FABRICATING THE SAME

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) or nanosheet (NS) field-effect transistors (FETs), have been incorporated into various memory and core devices to reduce IC chip footprint while maintaining reasonable processing margins. While methods of forming GAA FETs have generally been adequate, they have not been entirely satisfactory in all aspects. In one example, the bottommost FET in a stack of GAA FETs may experience poor performance, including, for example, a lack of gate control, short-channel effects, and/or increased capacitance, that are related to isolation structures (e.g., shallow-trench isolation, or STI, structures). Thus, for at least these reasons, improvements in methods of forming isolation structures in GAA FETs to reduce or eliminate current leakage associated with epitaxial S/D features are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a three-dimensional perspective view of an example semiconductor device according to various embodiments of the present disclosure.

FIGS. 4A, 5A, 6A, 8A, 9A, 10A, 11A, 12A, 13A, 14A, 15A, and 16A are cross-sectional views of the semiconductor device taken along line AA' as shown in FIG. 2, in part or in entirety, during intermediate stages of the method shown in FIG. 1 according to various embodiments of the present disclosure.

FIGS. 4B, 5B, 6B, 8B, 9B, 10B, 11B, 12B, 13B, 14B, 15B, and 16B are cross-sectional views of the semiconductor device taken along line BB' as shown in FIG. 2, in part or in entirety, during intermediate stages of the method shown in FIG. 1 according to various embodiments of the present disclosure.

FIGS. 17A, 17B, and 17C are schematic illustrations of a portion of the semiconductor device as shown in FIG. 16A according to various embodiments of the present disclosure.

DETAILED DESCRIPTION

Figure 1:
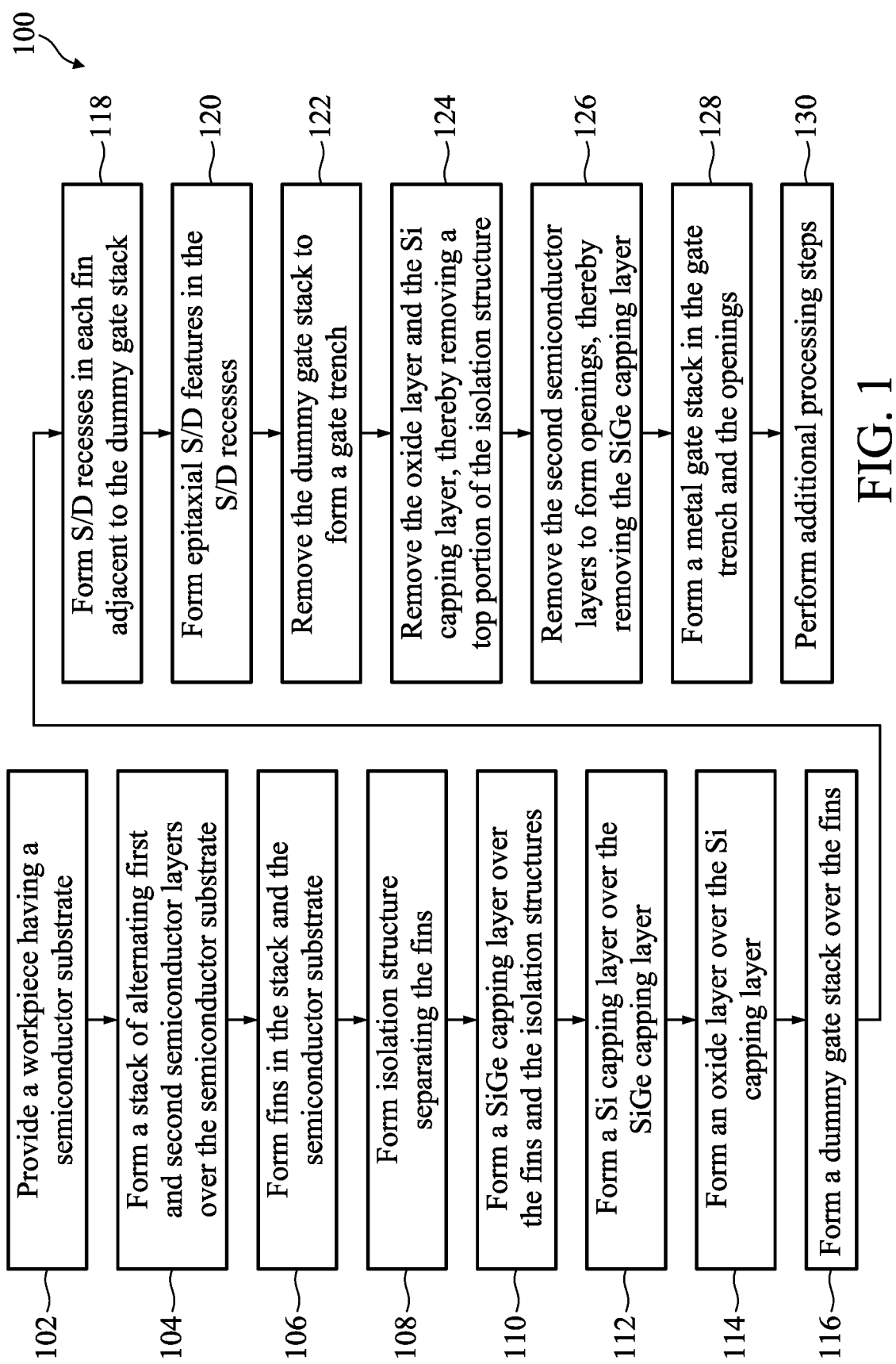
FIG. 1 illustrates a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

A GAA FET (also referred to as nanosheet, or NS, FETs) may generally include a vertical stack of channel layer as a part of a fin active region (or fin) protruding from a semiconductor substrate, epitaxial S/D features formed over or in S/D regions of the fin, and a metal gate stack disposed over an interleaved with the stack of channel layers in the channel region of the fin. While multi-gate FETs, such as GAA FETs, have generally improved the ability to scale down dimensions of semiconductor devices, such as memory devices, by providing more channel widths (in the form of vertically stacked channel layers) without enlarging device footprint or impacting the scaling of channel length, they have not been entirely satisfactory in all aspects. In some examples, due to presence of dopants in the epitaxial S/D features and/or other reasons, the GAA FET, especially in the region near the bottommost channel layer (termed the sub-channel region), may suffer high sub-threshold leakage current, leading to an undesirable increase in capacitance. Additionally, short-channel effects (SCEs) may be accentuated in or near the sub-channel region due to weak gate control brought about by excess isolation structures (e.g., thick shallow trench isolation, or STI, near the sub-channel region. For these and other reasons, improvements in the fabrication of GAA FETs are desired.

Figure 7:
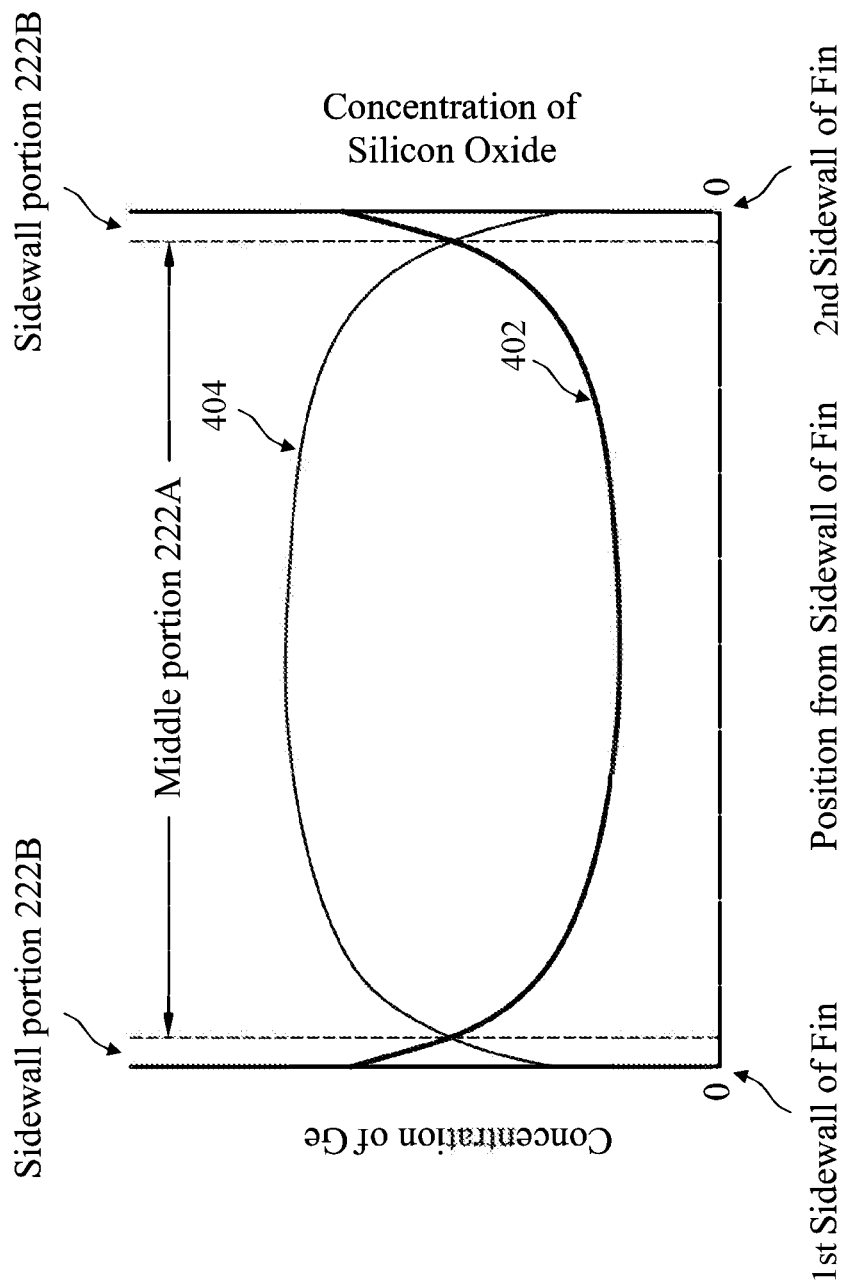
FIG. 7 is schematic concentration profiles within the semiconductor device as shown in FIG. 2 during intermediate stage(s) of the method shown in FIG. 1 according to various embodiments of the present disclosure.

Referring now to FIG. 1, a method 100 of forming a semiconductor device 200 (hereafter simply referred to as the device 200) is illustrated in a flowchart according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2-17C. In particular, FIGS. 3A, 4A, 5A, 6A, 8A, 9A, 10A, 11A, 12A, 13A, 14A, 15A, 16A, 17A, 17B, and 17C are cross-sectional views of the device 200, in part or in entirety, taken along line AA' shown in FIG. 2 at intermediate steps of method 100; FIGS. 3B, 4B, 5B, 6B, 7B, 8B, 9B, 10B, 11B, 12B, 13B, 14B, 15B, and 16B are cross-sectional views of the device 200, in part or in entirety, taken along line BB' shown in FIG. 2 at intermediate steps of method 100; and FIG. 7 is a schematic illustration of concentration of Ge and silicon oxide in a portion of the device 200 according to some embodiments of the present disclosure.

The device 200 may be an intermediate device fabricated during processing of an IC structure, or a portion thereof, that may comprise static random-access memory (SRAM) devices, logic devices, I/O devices, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In some embodiments, the device 200 is fabricated as an SRAM device in an IC structure that also includes a logic device, an I/O device, or a combination thereof. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

Figure 3:
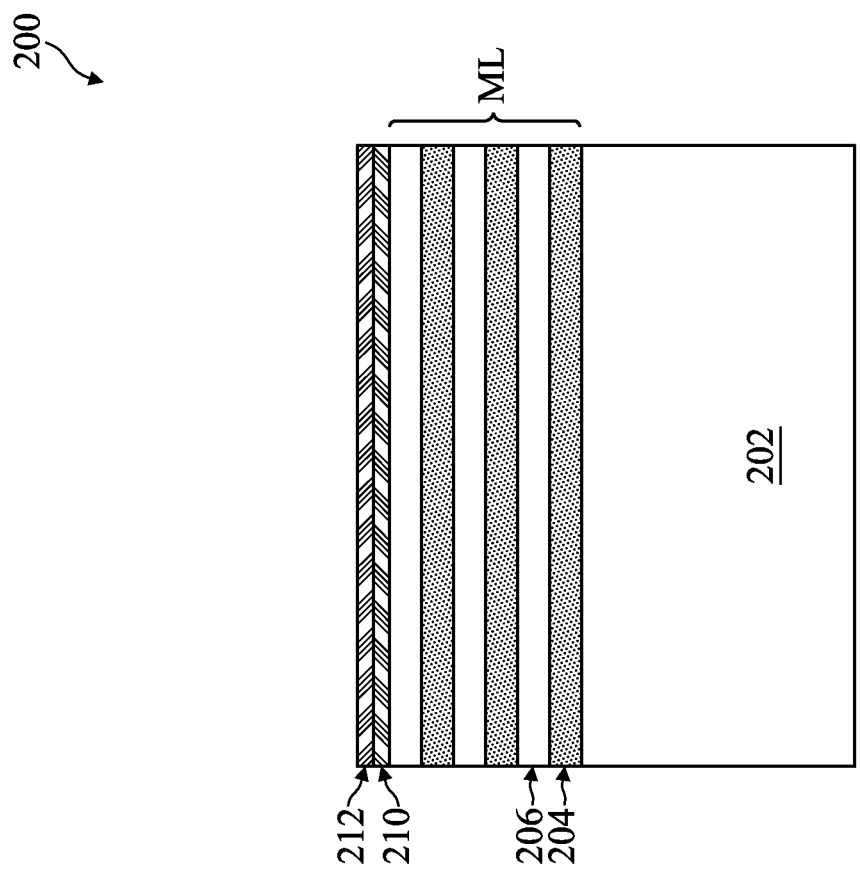
FIG. 3 is a cross-sectional view of the semiconductor device shown in FIG. 2 taken along line AA' or line BB', in part or in entirety, according to various embodiments of the present disclosure.
Figures 5A, 5B:
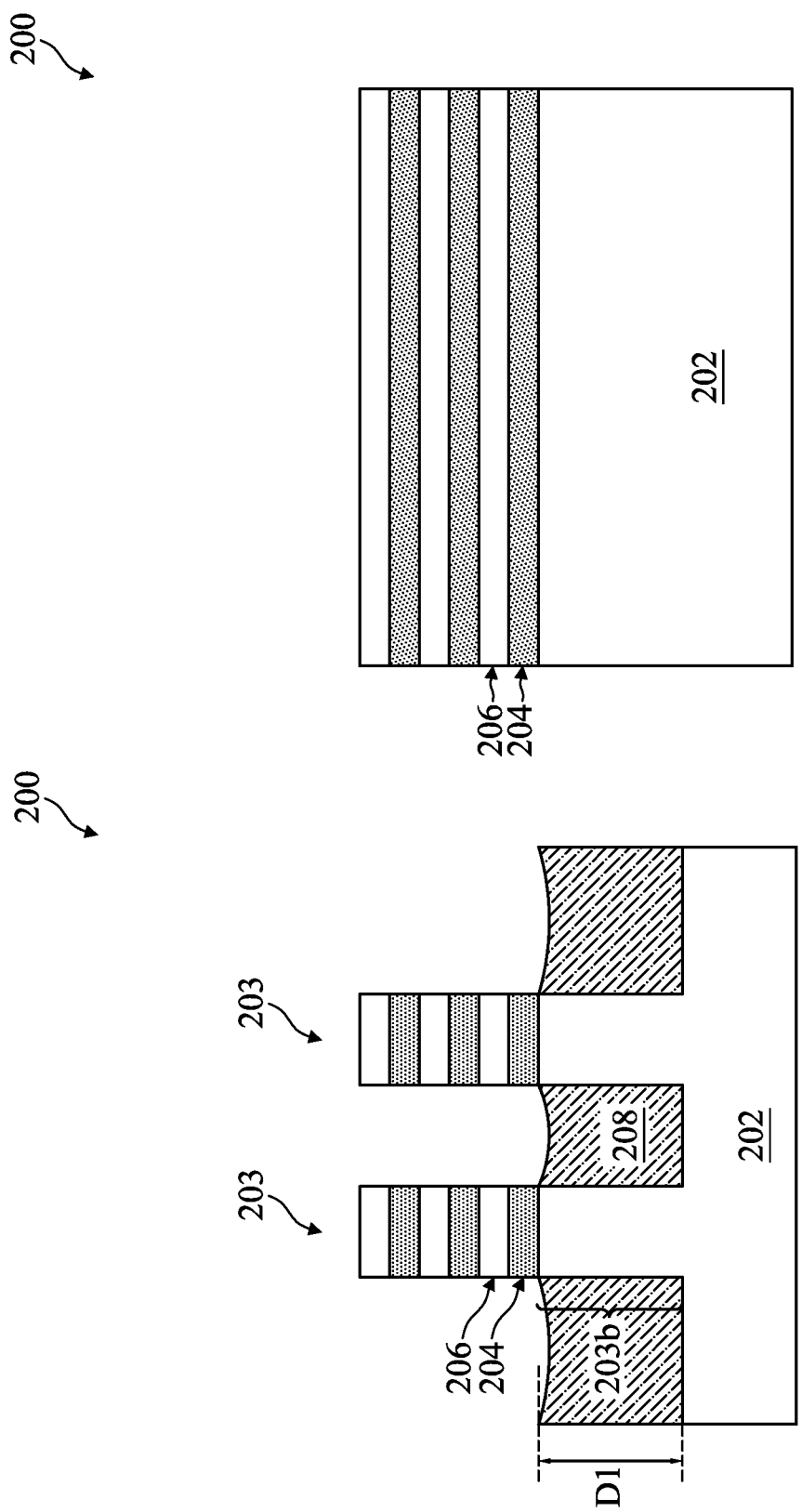

At operation 102, referring to FIGS. 1-3, method 100 provides a workpiece that includes a semiconductor substrate (hereafter referred to as the "substrate") 202. The semiconductor substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The semiconductor substrate 202 may be a single-layer material having a uniform composition. Alternatively, the semiconductor substrate 202 may include multiple material layers having similar or different compositions suitable for IC device manufacturing. In the present embodiments, the semiconductor substrate 202 includes elemental Si and has a uniform composition throughout its thickness (i.e., along the Z axis as depicted herein).

In some examples where the semiconductor substrate 202 includes FETs, various doped regions may be disposed in or on the semiconductor substrate 202. The doped regions may be doped with n-type dopants, such as phosphorus or arsenic, and/or p-type dopants, such as boron or $BF_2$, depending on design requirements. The doped regions may be formed directly on the semiconductor substrate 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting.

Still referring to FIGS. 1-3, method 100 at operation 104 forms a multi-layer stack (ML) of alternating semiconductor layers 204 and semiconductor layers 206 over the substrate 202. In the present embodiments, referring to the ML depicted in FIG. 3, each semiconductor layer 204 is a sacrificial layer configured to be removed during a subsequent processing step, while each semiconductor layer 206 remains in the device 200 and is configured as a channel layer to be engaged with a subsequently-formed metal gate stack. The present embodiments do not limit the compositions of the semiconductor layers 204 and 206, so long as they differ from each other. In one such example, each semiconductor layer 204 includes SiGe, and each semiconductor layer 206 includes elemental Si and is substantially free of Ge. In some examples, each ML may include a total of three to ten pairs of alternating semiconductor layers 204 and 206; of course, other configurations may also be applicable depending upon specific design requirements.

In the present embodiments, forming the ML includes alternatingly growing the semiconductor layers 204 and 206 in a series of epitaxy processes. Each epitaxy process may include chemical vapor deposition (CVD) techniques (e.g., vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. Each epitaxy process may use gaseous and/or liquid precursors, which interact with the composition of the underlying substrate. In some examples, the layers of the ML may be formed as nanosheets, nanowires, or nanorods. As discussed below, subsequent processing steps are configured remove the semiconductor layers 204 (e.g., the SiGe layers), leaving behind the semiconductor layers 206 (e.g., the Si layers) in a suspending structure. Such a process, which will be discussed in detail below, may be referred to as the "wire release process" or "sheet formation process," depending upon the configuration of the layers in the ML.

In some embodiments, still referring to FIG. 3, method 100 at operation 104 subsequently forms a hard mask layer (HM) 210 over the ML and an HM 212 over the HM 210. In the present embodiments, the HMs 210 and 212 are configured to protect top portions of the fins 203 during subsequent fabrication processes. In the present embodiments, the HMs 210 and 212 each include silicon nitride (SiN), silicon oxide (SiO and/or $SiO_2$), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, other suitable materials, or combinations thereof, provided that the HMs 210 and 212 differ in composition. In one such example, the HM 210 may include silicon oxide and the HM 212 may include silicon nitride.

Referring to FIGS. 1, 2, 4A, and 4B, method 100 at operation 106 forms fin active regions 203 (hereafter referred to as the "fins 203") over the substrate 202. In the present embodiments, each fin 203 includes a base portion, hereafter referred to as base fin 203b, that protrudes from the substrate 202 and the ML disposed over the base fin 203b. The fins 203 may each be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 203 protruding from the substrate 202. The etching process may include dry etching, wet etching, reactive ion etching (RIE), other suitable processes, or combinations thereof. In some embodiments, as depicted in FIG. 4A, the fins 203 may be formed to a trapezoidal profile as indicated by the dashed line, such that a width of the fin 203 increases from top to bottom along a height of the fin 203.

Numerous other embodiments of methods for forming the fins 203 may be suitable. For example, the fins 203 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 203.

Now referring to FIGS. 1, 2, 5A, and 5B, method 100 at operation 108 forms isolation features 208 over the substrate 202 to separate (or insulate) bottom portions of the fins 203. The isolation features 208 may include silicon oxide (SiO and/or $SiO_2$), fluoride-doped silicate glass (FSG), a low-k dielectric material, other suitable materials, or combinations thereof. In the present embodiments, the isolation features 208 include silicon oxide but are substantially free of Ge, i.e., any trace amount of Ge is inconsequential to the overall property and processing of the isolation features 208. In some embodiments, the isolation features 208 include about 40% (weight %) of Si and about 60% of O. The isolation features 208 may include shallow trench isolation (STI) features. Other isolation structure such as field oxide, local oxidation of silicon (LOCOS), and/or other suitable structures may also be implemented as the isolation features 208. In some examples, the isolation features 208 may include a multi-layer structure, for example, having one or more thermal oxide liner layers.

In the present embodiments, forming the isolation features 208 includes depositing an isolating material described over the substrate 202, thereby filling the trenches separating the fins 203, applying one or more chemical mechanical planarization (CMP) process to planarize the device 200, and subsequently etching back portions of the isolation material to form the isolation features 208, such that the top surface of the isolation features 208 is below a top surface of the fins 203. The isolating material may be deposited by any suitable method, such as CVD, flowable CVD (FCVD), spin-on-glass (SOG), other suitable methods, or combinations thereof. A curing process may be applied after the depositing and planarizing the isolation material. In some embodiments, as depicted herein, the isolation features 208 include a concave surface following the etching back process, where the portion of the top surface of the isolation features 208 away from sidewalls of the fins 203 is lower than portions closer to the sidewalls of the fins 203. In this regard, the isolation features 208 may be described by an average thickness D1 accounting for the varying thicknesses due to the concave surface, where D1 may be about 250 nm to about 350 nm. Of course, such range of values are for illustrative purposes only and other dimensions may also be applicable to the present embodiments. In some embodiments, the thickness D1 corresponds to a height of the base fin 203b.

Referring to FIGS. 1, 6A, and 6B, method 100 at operation 110 deposits a SiGe capping layer 220 over the device 200. In the present embodiments, the SiGe capping layer 220 includes a first portion 220A having a thickness T1 formed on the top surface and on the sidewalls of the fins 203, a second portion 220B having a thickness T2 formed on the top surface of the isolation features 208, and a third portion 220C having a thickness T3 formed at a corner where the sidewall of each fin 203 meets the top surface of the isolation features 208. The SiGe capping layer 220 may be formed by a deposition process 302, which may include any suitable deposition technique, such as an atomic layer deposition (ALD) process implemented in a CVD tool, provided that the deposition process 302 allows the second portion 220B of the SiGe capping layer 220 to be deposited on the isolation features 208. In some embodiments, the thicknesses T1, T2, and T3 are each about 1 nm to about 3 nm. In some embodiments, because the isolation features 208 may not include a crystalline material having ordered crystal structure similar to that of SiGe, the SiGe capping layer 220 grows on surfaces of the fins 203, which includes the semiconductor layers 204 and 206, at a higher rate than on surfaces of the isolation features 208, resulting in the thickness T1 being greater than the thickness T2 and the thickness T3 being greater than the thickness T2. In other words, the thickness of the SiGe capping layer 220 generally decreases across the top surface of the isolation features 208 in a direction away from the sidewall of the fin 203.

In the present embodiments, following the deposition process 302, Ge present in the second portion 220B and the third portion 220C of the SiGe capping layer 220 diffuses into top portions of the isolation features 208 in a diffusion process 304 to form a Ge-doped layer 222 in the isolation features 208, and the second portion 220B and the third portion 220C consequently become Ge-depleted, i.e., containing less Ge than the first portion 220A of the SiGe capping layer 220. Stated differently, portions of the SiGe capping layer 220 formed on the surfaces of the fins 203 include more Ge than those portions formed over the isolation features 208. In some embodiments, such depletion causes the concentration of Ge to gradually decrease and the concentration of Si to gradually increase toward the Ge-doped layer 222. In the depicted embodiments, the Ge-doped layer 222 includes a sidewall portion 222B disposed below the third portion 220C and a middle portion 222A disposed below the second portion 220B. In the present embodiments, the isolation features 208 includes silicon oxide (SiO and/or $SiO_2$), and the Ge-doped layer 222 includes a combination of silicon oxide and Ge, or Ge-doped silicon oxide. Accordingly, the Ge-doped layer 222 may alternatively be referred to as a GeSiO region 222.

The diffusion process 304, schematically illustrated by the dashed downward arrows in FIG. 6A, may be driven by the difference in concentration of Ge between the second portion 220B and the isolation features 208, which is substantially free of any Ge. For at least this reason, in the present embodiments, the amount of Ge in the SiGe capping layer 220 is at least about 40% (weight %) to drive the diffusion of Ge into the isolation features 208. However, as will be discussed in detail below, the amount of Ge in the SiGe capping layer 220 may not exceed about 80% to ensure that the second portion 220B and the third portion 220C are oxidized and subsequently removed to expose the Ge-doped layer 222 over the isolation features 208 in subsequent processing steps. In other words, if the amount of Ge in the SiGe capping layer 220 exceeds about 80%, then the oxidation and removal of the second portion 220B and the third portion 220C may be impeded during subsequent processes.

As discussed above, the thickness of the SiGe capping layer 220 is the greatest near the sidewall of the fin 203 and decreases along the top surface of the isolation features 208 away from the fin 203. Accordingly, the amount of Ge in the Ge-doped layer 222 also changes across the top surface of the isolation features 208 (i.e., between sidewalls of adjacent fins 203). Referring to FIG. 7, which illustrates an example diffusion profile 402 of Ge and an example diffusion profile 404 of silicon oxide in the Ge-doped layer 222 across the top surface of the isolation features 208, the middle portion 222A corresponds to a region of the Ge-doped layer 222 in which the concentration of silicon oxide is greater than the concentration of Ge, and the sidewall portion 222B corresponds to a region of the Ge-doped layer 222 in which the concentration of Ge is greater than the concentration of silicon oxide. Accordingly, the concentration of silicon oxide in the sidewall portions 222B is lower than the concentration of silicon oxide in the middle portion 222A. In addition, referring back to FIG. 6A, because the Ge-doped layer 222 defines a region of silicon oxide over which Ge is present, a thickness of the Ge-doped layer 222 varies as a function of the concentration of Ge across the top surface of the isolation features 208. In the present embodiments, a greater amount of Ge corresponds to a greater thickness of the Ge-doped layer 222, i.e., a thickness T4 of the sidewall portion 222B is greater than a thickness T5 of the middle portion 222A away from the sidewall portion 222B. In this regard, the Ge-doped layer 222 may be described by an average thickness D2 that accounts for the varying thicknesses across the top surface of the isolation features 208. In some examples, D2 may be about 50 nm to about 200 nm, and a ratio of D2 to D1 (as defined above in reference to FIG. 5A) may be about 0.2 to about 0.6. Of course, the present embodiments are not limited to such dimensions and other dimensions may also be applicable based on various design requirements.

Now referring to FIGS. 8A and 8B, method 100 at operation 112 forms a Si capping layer 230 over the SiGe capping layer 220. In the present embodiments, the Si capping layer 230 is formed over the fins 203 as well as the top surface of the isolation features 208. As provided herein, the Si capping layer 230 differs from the SiGe capping layer 220 in that the Si capping layer 230 is free, or substantially free, of Ge. Furthermore, because the Si capping layer 230 is formed over the SiGe capping layer 220 having ordered crystalline structure, the Si capping layer 230 is formed to substantially uniform thickness. For example, referring to FIG. 8A, a thickness T1' of the Si capping layer 230 formed on the first portion 220A is substantially the same as a thickness T2' of the Si capping layer 230 formed on the second portion 220B and a thickness T3' of the Si capping layer 230 formed on the third portion 220C. In some examples, the thickness T1', T2', and T3' may each be formed to a thickness of about 1 nm to about 3 nm. The Si capping layer 230 may be formed by a deposition process 306, which may be any suitable process including, for example, the epitaxy process discussed in detail above with respect to forming the ML.

Figures 9A, 9B:
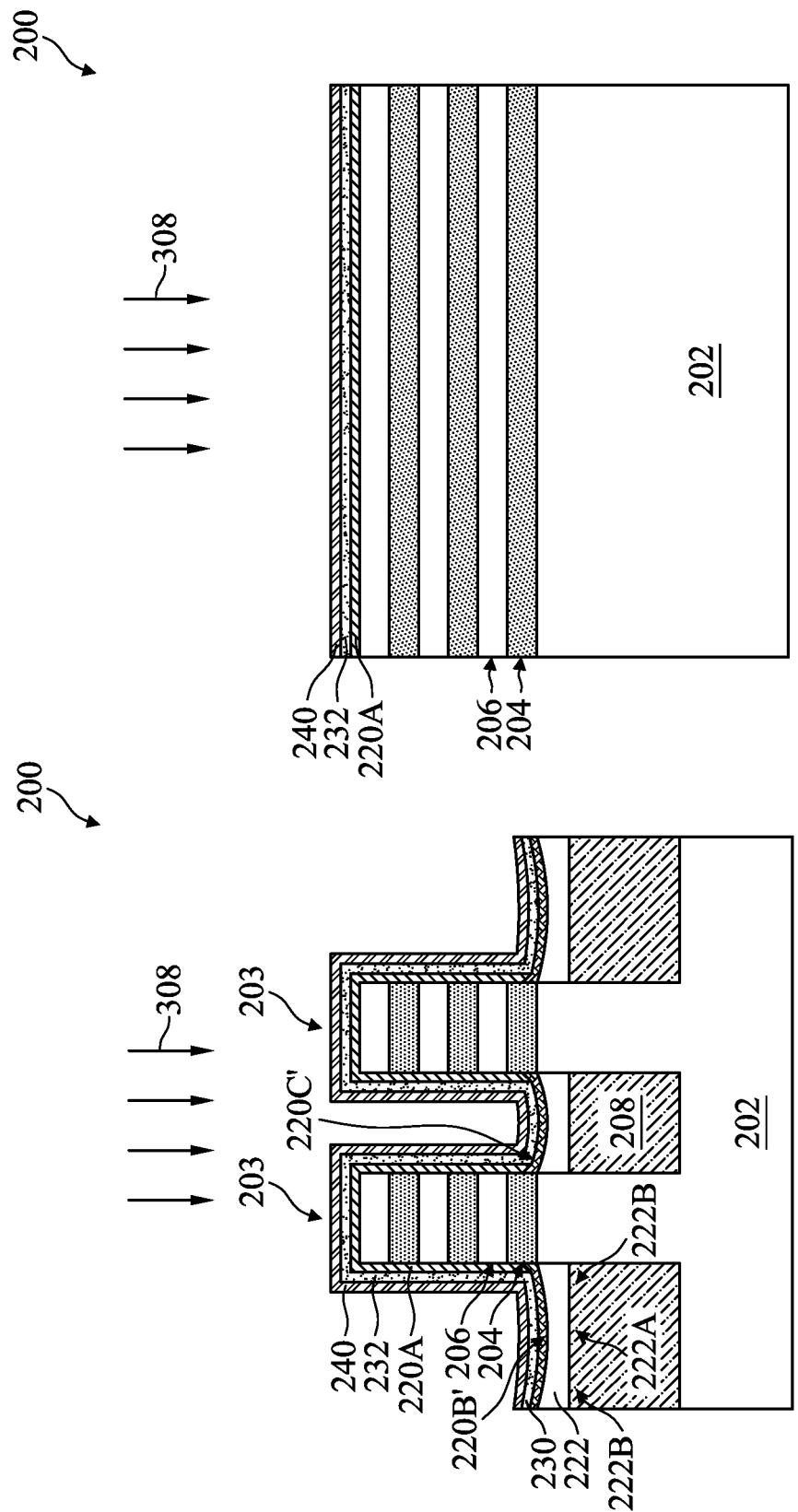

Referring to FIGS. 9A and 9B, method 100 at operation 114 forms an oxide layer 240 over the Si capping layer 230. In the present embodiments where the device 200 is configured as an SRAM device and an I/O device (not depicted) is also formed over the substrate 202, the oxide layer 240 is formed to accommodate fabrication of the I/O device and is removed from the device 200 at a subsequent processing step. The oxide layer 240 may include silicon oxide and may be formed by deposition process 308, which may be any suitable process including, for example, thermal oxidation, chemical oxidation, CVD, FCVD, ALD, other suitable methods, or combinations thereof.

In the present embodiments, forming the oxide layer 240 oxidizes the Si capping layer 230 to form an oxidized Si capping layer 232. Furthermore, due to the depletion of Ge, forming the oxide layer 240 also oxidizes Si to form silicon oxide in the second portion 220B and the third portion 220C of the SiGe capping layer 220 to form the oxidized second portion 220B' and the oxidized third portion 220C', respectively. In some embodiments, the extent of such oxidation is related to the amount of Ge remaining in the second portion 220B and the third portion 220C after the diffusion process 304 and the amount of Ge present in the as-deposited SiGe capping layer 220 before the diffusion process 304. If the amount of Ge in as-deposited the SiGe capping layer 220 is too high, e.g., exceeding about 80% as discussed above, the amount of Ge remaining in the second portion 220B and the third portion 220C may impede the oxidation of Si to form the oxidized second portion 220B' and the oxidized third portion 220C'.

Now referring to FIGS. 1, 10A, and 10B, method 100 at operation 116 forms a dummy gate stack (i.e., a placeholder gate) 242 that includes a polysilicon layer over the fins 203. In the present embodiments, portions of the dummy gate stack 242 are replaced with a high-k (i.e., a dielectric material having a dielectric constant greater than that of silicon dioxide, which is about 3.9) metal gate stack (HKMG) after forming other components of the device 200. The dummy gate stack 242 may be formed by a series of deposition and patterning processes. For example, the dummy gate stack 242 may be formed by depositing a polysilicon layer over the fins 203 and performing an anisotropic etching process (e.g., a dry etching process) to remove portions of the polysilicon. Though not depicted, one or more HMs similar to the HMs 210 and 212 discussed above may be formed over the dummy gate stack 242 to protect the dummy gate stack 242 from being etched during subsequently operations. The one or more HMs are later removed before removing the dummy gate stack 242 to form the HKMG.

Thereafter, still referring to FIGS. 10A and 10B, top spacers 246 may be formed on sidewalls of the dummy gate stack 242. The top spacers 246 may be a single-layer structure or a multi-layer structure and may include silicon nitride (SiN), silicon oxide (SiO and/or $SiO_2$), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, other suitable materials, or combinations thereof. Each spacer layer of the top spacers 246 may be formed by first depositing a dielectric layer over the dummy gate stack 242 and subsequently removing portions of the dielectric layer in an anisotropic etching process (e.g., a dry etching process), leaving portions of the dielectric layer on the sidewalls of the dummy gate stack 242 as the top spacers 246.

Figure 11B:
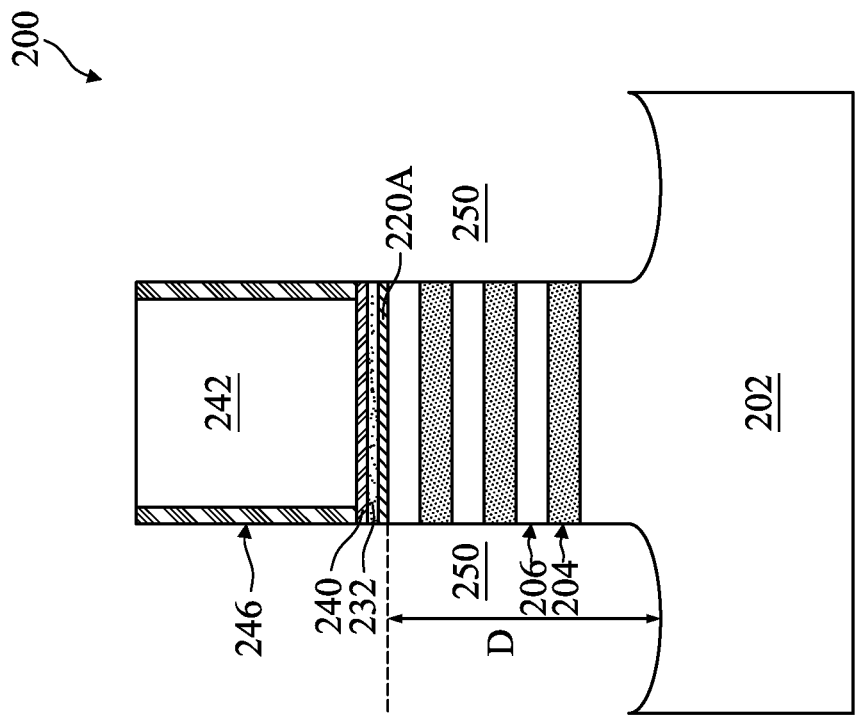
Figure 11A:
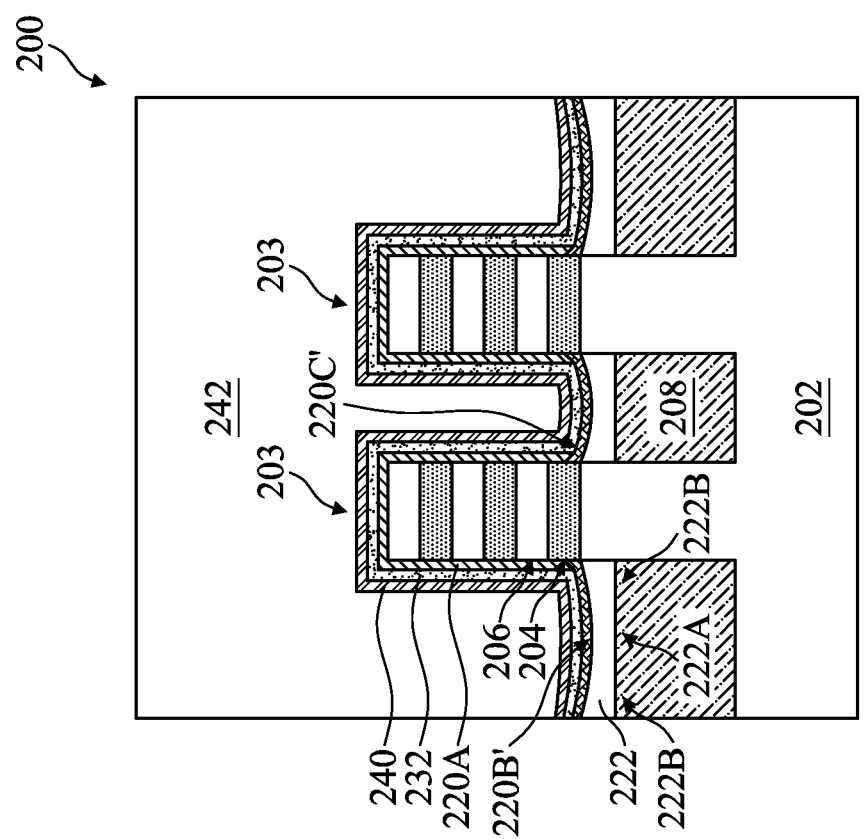

Referring to FIGS. 1, 11A, and 11B, method 100 at operation 118 removes portions of the fins 203 (including the ML) to form S/D recesses 250. The S/D recess 250 may be formed by a dry etching process, a wet etching process, RIE, other suitable etching processes, or combinations thereof. In some embodiments, the oxide layer 240 is removed in a first etching process selective to silicon oxide, followed by a second etching process selective to compositions of the semiconductor layers 204 and 206, e.g., Si and SiGe. In some embodiments, the etching process is a dry etching process employing a suitable etchant capable of removing Si (i.e., the semiconductor layers 206) and SiGe (i.e., the semiconductor layers 204) of the ML. In some examples, the dry etchant may be a chlorine-containing etchant including $Cl_2$, $SiCl_4$, $BCl_3$, other chlorine-containing gas, or combinations thereof. Various parameters of the etching process including, for example, duration, temperature, pressure, source power, bias voltage, bias power, and/or etchant flow rate may be adjusted to control a depth D of the S/D recesses 250. In some embodiments, the S/D recesses 250 extend to below a bottommost layer of the ML, i.e., the depth D is greater than an overall thickness of the ML. A cleaning process may subsequently be performed to clean the S/D recesses 250 with a hydrofluoric acid (HF) solution or other suitable solution.

Figure 12A:
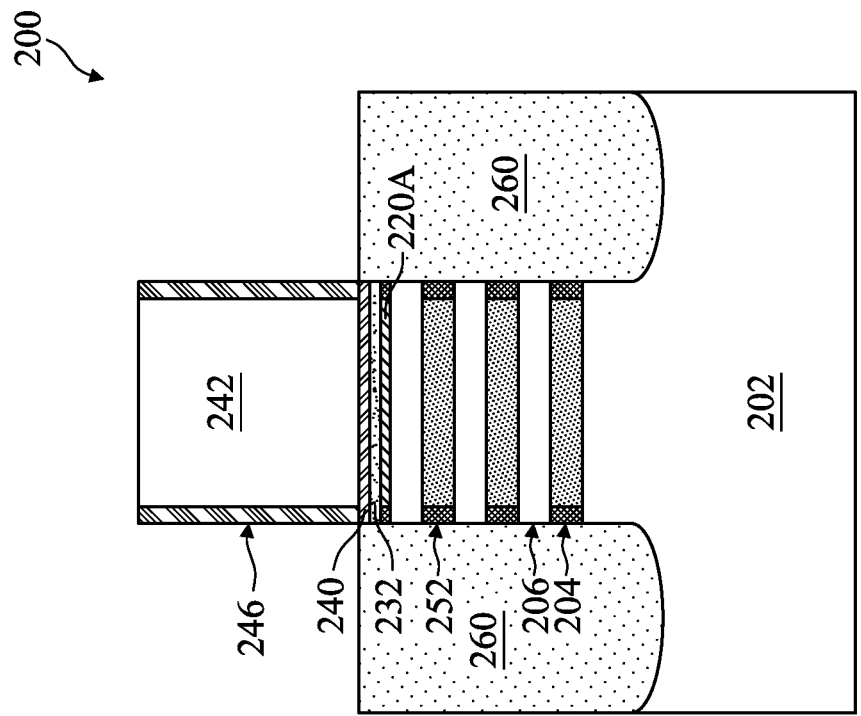
Figure 12B:
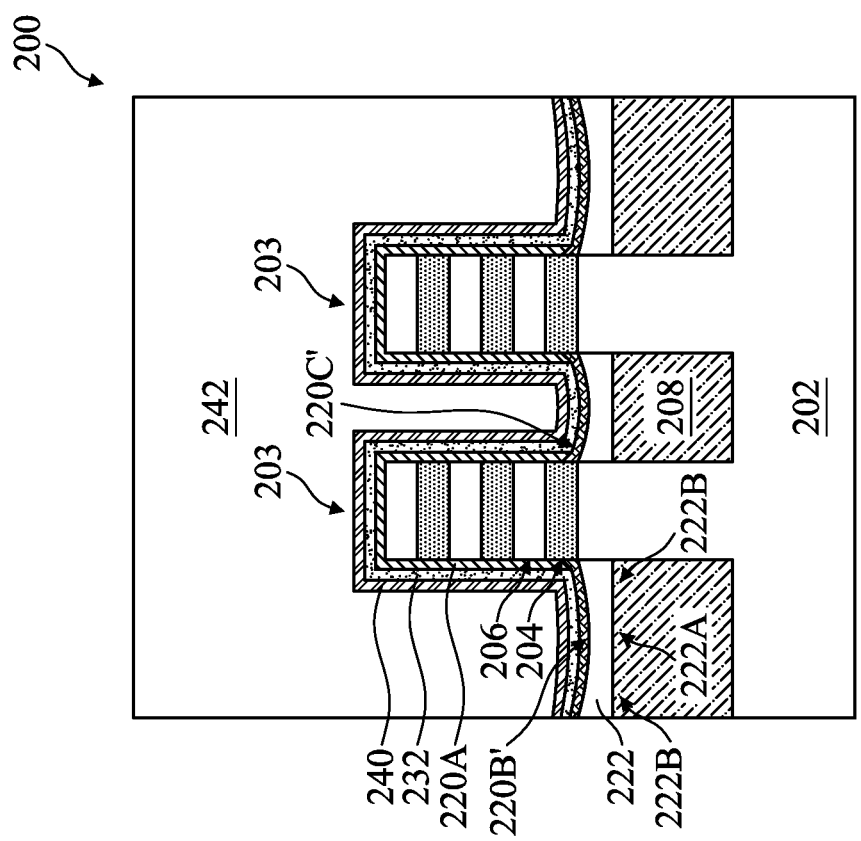

Referring to FIGS. 1, 12A, and 12B, method 100 at operation 120 forms epitaxial S/D features 260 in the S/D recesses 250. In the present embodiments, before forming the epitaxial S/D features 260, method 100 first forms inner spacers 252 on sidewalls of the semiconductor layers 204 and the SiGe capping layer 220 (i.e., the first portion 220A) exposed in the S/D recesses 250. The inner spacers 252 may include any suitable dielectric material comprising silicon, carbon, oxygen, nitrogen, other elements, or combinations thereof. For example, the inner spacers 252 may include silicon nitride (SiN), silicon oxide (SiO and/or $SiO_2$), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), air, other suitable dielectric material, or combination thereof. The inner spacers 252 may each be configured as a single-layer structure or a multi-layer structure including a combination of the dielectric materials provided herein. In some embodiments, the inner spacers 252 have a different composition from that of the top spacers 246.

The inner spacers 252 may be formed in a series of etching and deposition processes. For example, forming the inner spacers 252 may begin with selectively removing portions of the semiconductor layers 204 with respect to the semiconductor layers 206 to form trenches (not depicted). The semiconductor layers 204 may be removed by any suitable process, such as a dry etching process. Subsequently, one or more dielectric layers are formed in the trenches, followed by one or more etching processes to remove (i.e., etch back) excess dielectric layer(s) deposited on exposed surfaces of the semiconductor layers 206, thereby forming the inner spacers 252. The one or more dielectric layers may be deposited by any suitable method, such as ALD, CVD, physical vapor deposition (PVD), other suitable methods, or combinations thereof.

Still referring to FIGS. 12A and 12B, method 100 at operation 120 subsequently forms epitaxial S/D feature 260 in each S/D recesses 250 and over the inner spacers 252.

Each of the epitaxial S/D features 260 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, one or more epitaxy growth processes are performed to grow an epitaxial material in each S/D recess 250. For example, an epitaxy growth process similar to that discussed above with respect to forming the ML may be implemented to form the epitaxial S/D features 260. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 260.

Referring to FIGS. 1, 13A, and 13B, method 100 at operation 122 subsequently removes the dummy gate stack 242 to form a gate trench 272 between the top spacers 246. Before removing the dummy gate stack 242, method 100 forms an interlayer dielectric (ILD) layer 270 over the epitaxial S/D features 260 by CVD, FCVD, SOG, other suitable methods, or combinations thereof, and subsequently planarizes the ILD layer 270 in one or more CMP processes to expose a top surface of the dummy gate stack 242. The ILD layer 270 may include silicon oxide, a low-k dielectric material, TEOS, doped silicon oxide (e.g., BPSG, FSG, PSG, BSG, etc.), other suitable dielectric materials, or combinations thereof. In some embodiments, method 100 first forms an etch-stop layer (ESL; not depicted) over the epitaxial S/D features 260 before forming the ILD layer 270. The ESL may include silicon nitride (SiN), carbon-containing silicon nitride (SiCN), oxygen-containing silicon nitride (SiON), carbon-and-oxygen-doped silicon nitride (SiOCN), aluminum nitride (AlN), oxygen-doped aluminum nitride (AlON), other suitable materials, or combinations thereof, and may be formed by CVD, PVD, ALD, other suitable methods, or combinations thereof. Thereafter, at least portions of the dummy gate stack 242 are removed from the device 200 to form the gate trench 272 by any suitable etching process, such as a dry etching process.

Figure 14B:
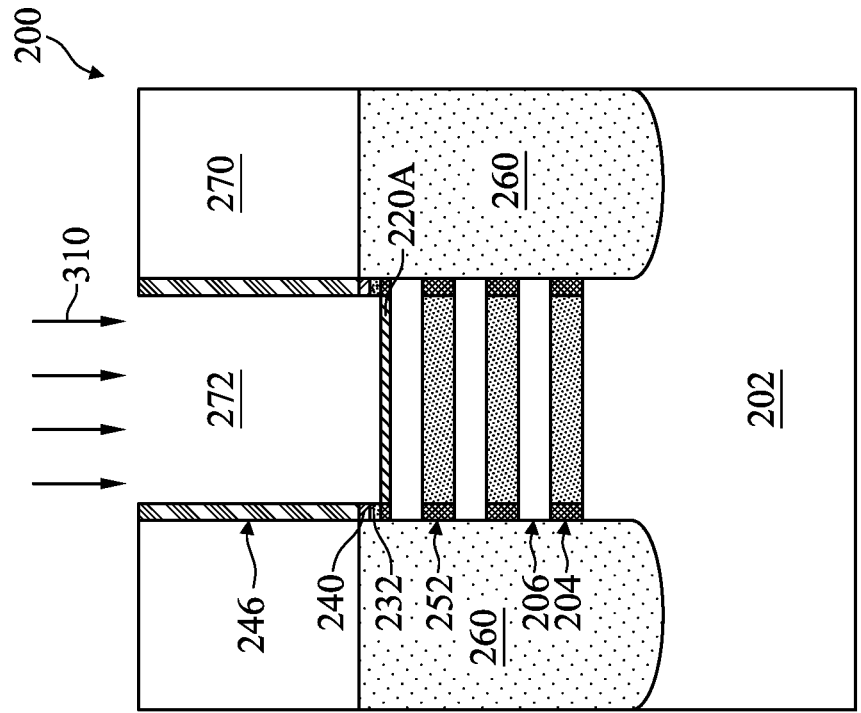
Figure 14A:
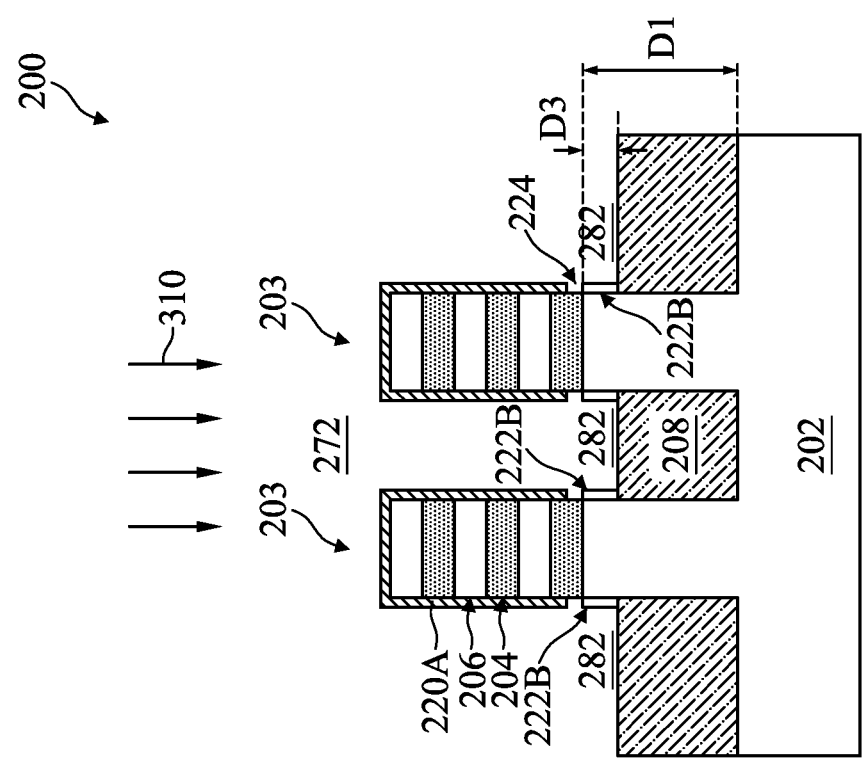

Now referring to FIGS. 1, 14A, and 14B, method 100 at operation 124 removes the oxide layer 240 from the device 200 in an etching process 310, thereby resulting in a recess 282 in the isolation features 208. In some embodiments, the oxide layer 240 is removed from the SRAM device region and the logic device region, but remains over the I/O device region, of the device 200. In the present embodiments, the etching process 310 is configured to remove silicon oxide at a higher rate than elemental Si, elemental Ge, and/or SiGe. In this regard, the etching process 310 selectively removes the oxide layer 240, the oxidized Si capping layer 232, the oxidized second portion 220B', and the oxidized third portion 220C' with respect to the first portion 220A of the SiGe capping layer 220, which has been protected by the oxidation of the Si capping layer 230.

Furthermore, as discussed above with reference to FIG. 7, the diffusion of Ge from the SiGe capping layer 220 to the isolation features 208 causes the middle portion 222A of the Ge-doped layer 222 to have relatively more silicon oxide than the sidewall portions 222B, such that the etching process 310 also selectively removes the middle portion 222A with respect to the sidewall portions 222B of the Ge-doped layer 222. In other words, portions of the Ge-doped layer 222 may remain on the sidewalls of the fins 203 (i.e., the base fins 203b). In some embodiments, as depicted herein, because the oxidized third portion 220C' is disposed above the sidewall portions 222B, a void 224 is present above the sidewall portion 222B. In some embodiments, a depth D3 of the recess 282 is about 50 nm to about 200 nm, which is generally consistent with the average thickness D2 of the Ge-doped layer 222 formed at operation 110. Accordingly, a ratio of D3 to the average thickness D1 of the isolation features 208 (as defined above in reference to FIG. 5A) may be about 0.2 to about 0.6. Of course, the present embodiments are not limited to these dimensions, and other dimensions may also be applicable according to various design requirements.

The etching process 310 may include a wet etching process, a dry etching process, an RIE process, other suitable processes, or combinations thereof. In some embodiments, the etching process 310 implements a fluorine-containing etchant including, for example, carbon tetrafluoride ($CF_4$), hydrofluoric acid (HF; in a wet etching process), ammonium fluoride ($NH_4F$), and/or other suitable etchants configured to selectively remove silicon oxide with respect to elemental Si, elemental Ge, and/or SiGe.

Referring to FIGS. 1, 15A, and 15B, method 100 at operation 126 removes the semiconductor layers 204 from the ML during the sheet (or wire) formation process 312, thereby forming openings 280 between the semiconductor layers 206. In the present embodiments, the sheet formation process 312 is configured to remove SiGe and/or elemental Ge at a higher rate than elemental Si and silicon oxide. Accordingly, in the present embodiments, removing the semiconductor layers 204, which include SiGe, also removes the remaining portions of the SiGe capping layer 220 (i.e., the first portion 220A remaining over the fins 203) and the remaining sidewall portions 222B of the Ge-doped layer 222, which includes elemental Ge and silicon oxide. As discussed above, the sidewall portions 222B includes a greater amount of Ge than the middle portion 222A, which has been oxidized and subsequently removed with the oxide layer 240, inter alia, at operation 124. Accordingly, the removal of the Ge-doped layer 222 by the sheet formation process 312 exposes sidewalls of the fins 203 in the recess 282. In other words, the resulting recess 282 has sidewall surfaces defined by the sidewalls of the fins 203 (i.e., the base fins 203b) and a bottom surface defined by the recessed isolation features 208.

In some instances, as discussed in detail below, the portions of the sidewalls of the fins 203 may not be entirely exposed by the sheet formation process 312 to result in a depth of the recess 282 that corresponds to the depth D3. Accordingly, in some embodiments, the portions of the sidewalls of the fins 203 exposed by the sheet formation process 312 have a height D4 less than the depth D3, i.e., the recess 282 has a sidewall profile that tapers away from the sidewalls of the fins 203 as indicated by the dotted profile in FIG. 15A. Accordingly, a ratio of D4 to D3 may not exceed 1 and may be about 0.3 to about 0.5 in some embodiments. Furthermore, in some embodiments, a ratio of the height D4 to the thickness D1 is at least about 0.1, where the thickness D1 is defined above in reference to FIG. 5A and may correspond to the height of the base fin 203b in some embodiments. In the present disclosure, if the ratio of the height D4 to the thickness D1 falls below about 0.1, the exposure of the sidewalls of the fins 203 is sufficient to allow coverage by the subsequently-formed metal gate stack. It is noted that the present embodiments do not limit a maximum value the height D4 to any particular dimension, so long as the height D4 does not exceed the depth D3 of the recess 282. In some examples, the height D4 may be about 50 nm to about 100 nm, and a ratio of the height D4 to the thickness D1 may be less than about 0.4. In some embodiments, the height D4 is configured such that the exposure of the sidewalls of the fins 203 in the recess 282 is maximized, thereby improving metal gate coverage as will be discussed in detail below. In some instances, increasing the height D4 may be accomplished by increasing the amount of Ge present in the SiGe capping layer 220, thereby increasing the thickness D2 of the resulting Ge-doped layer 222, though not exceeding about 80% as discussed above to ensure complete removal thereof by the etching process 310 and the sheet formation process 312.

The sheet formation process 312 may be implemented by any suitable etching process, such as a dry etching process, a wet etching process, an RIE process, or combinations thereof, configured to remove elemental Ge and/or SiGe at a higher rate than elemental Si and silicon oxide. In one example, the sheet formation process 312 implements a wet etching process that employs ozone ($O_3$; dissolved in water), nitric acid ($HNO_3$), hydrogen peroxide ($H_2O_2$), other suitable oxidants, or combinations thereof. In another example, the sheet formation process 312 implements a dry etching process that employs a fluorine-based etchant such as hydrofluoric acid (HF). In some embodiments, as depicted in dotted profile in FIG. 15A, the etching process 310 results in the recess 282 to have rounded bottom corners due to an amount of etchant loading being less near the bottom corners than near a center of the recess 282. However, irrespective of the presence of the bottom corners, the recess 282 exposes at least portions of the sidewalls of the fins 203 as discussed in detail above, having a height corresponding to D4.

Now referring to FIGS. 16A and 16B, method 100 at operation 128 forms the HKMG 290 in the gate trench 272 and in the openings 280, such that the HKMG 290 are interposed between the epitaxial S/D features 260. In the present embodiments, a top portion of the HKMG 290 is formed between the top spacers 246 and a bottom portion of the HKMG 290 is disposed between the semiconductor layers 206, which are channel layers of the device 200.

The HKMG 290 may include at least an interfacial layer 292 wrapping around each semiconductor layer 206, a high-k dielectric layer 294 disposed over the interfacial layer 292, and a metal gate electrode 296 disposed over the high-k dielectric layer 294. The interfacial layer 292 may include an oxide material, such as silicon oxide, and the high-k dielectric layer 294 may include any suitable dielectric material, such as hafnium oxide, lanthanum oxide, other suitable materials, or combinations thereof. The metal gate electrode 296 may include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG 290 may further include numerous other layers (not depicted), such as a capping layer, a barrier layer, other suitable layers, or combinations thereof. Various layers of the HKMG 290 may be deposited by any suitable method, such as chemical oxidation, thermal oxidation, ALD, CVD, PVD, plating, other suitable methods, or combinations thereof.

As depicted in FIGS. 16A and 16B, the base fin 203b protruding from the isolation features 208 forms a GAA FET with the HKMG 290 in a sub-channel region 290'. While current methods of fabricating the device 200 may result in the top surface of the isolation features 208 to be slightly recessed and acquire a shallow concave profile (see, for example, FIG. 5A), such shallow concave profile leaves portions of the isolation features 208 to remain on the sidewalls of the portion of the fin 203 disposed below the semiconductor layers 206. Consequently, referring to FIG. 17A, which depicts the sub-channel region 290' in greater detail, such concave profile causes the bottom portion of the HKMG 290 to be separated from the sidewalls of the fin 203 (i.e., the base fin 203b) by portions of the isolation features 208, and such separation may be defined by a lateral distance S, which is greater than zero. While such structure generally does not interfere with performance of the portions of the HKMG 290 that are engaged with the semiconductor layers 206, the lack of gate coverage in the sub-channel region 290' may result in weaker gate control, potential sub-threshold leakage current, and/or an increase in capacitance adversely affecting the performance of the GAA FET.

To remedy this and other shortcomings, referring to FIG. 17B, which is substantially the same as the embodiment depicted in FIG. 16A, the present disclosure provides embodiments of GAA FET having intentionally recessed isolation features 208, such that the subsequently-formed HKMG 290 may wrap around and directly engage with the sidewalls of the base fin 203b, such that the lateral separation distance S may be reduced to approximately zero, thereby improving the gate coverage in the sub-channel region 290'. In some embodiments, referring to FIG. 17C, the recessed isolation features 208 may be defined by a top surface having a tapered sidewall profile in accordance with the dotted profile depicted in FIGS. 15A and 16A to ensure that at least a bottom portion of the HKMG 290 is in direct contact with the sidewalls of the base fin 203b. In the present embodiments, referring to FIG. 17C, a thickness of the bottom portion of the HKMG 290 in direct contact with the sidewalls of the base fin 203b is defined by the height D4, which is discussed in detail above. In the depicted embodiments, the tapered sidewall profile may be defined by the height D3 and D4 as discussed above in reference to FIG. 15A.

Thereafter, method 100 at operation 130 may perform additional processing steps to the device 200. For example, method 100 may form S/D contacts (not depicted) over the epitaxial S/D features 260. Each S/D contact may include any suitable conductive material, such as Co, W, Ru, Cu, Al, Ti, Ni, Au, Pt, Pd, other suitable conductive materials, or combinations thereof. Method 100 may form an ILD layer similar to the ILD layer 270 over the HKMG 290, form an S/D contact hole (or trench) therein via a series of patterning and etching processes, and subsequently deposit a conductive material in the S/D contact opening using any suitable method, such as CVD, ALD, PVD, plating, other suitable processes, or combinations thereof. In some embodiments, a silicide layer (not depicted) is formed between the epitaxial S/D features 260 and the S/D contact. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. Subsequently, method 100 may form additional features over the device 200 such as, for example, a gate contact (not depicted) in the ILD layer to contact the HKMG 290, vertical interconnect features (e.g., vias; not depicted), horizontal interconnect features (e.g., conductive lines; not depicted), additional intermetal dielectric layers (e.g., ESLs and ILD layers; not depicted), other suitable features, or combinations thereof.

The present disclosure provides a semiconductor structure that includes a semiconductor fin having a bottom portion that extends above isolation features (e.g., STI), where a subsequently-formed metal gate stack directly contacts top and sidewall surfaces of the bottom portion, and a top portion that comprises a vertical stack of semiconductor channel layers engaged with the metal gate stack to form a GAA FET. The present embodiments provide a method of recessing the isolation features that includes forming a SiGe-based capping layer over the semiconductor fin, a Si-based capping layer over the SiGe-based capping layer, and a silicon oxide-based layer over the Si-based capping layer, where forming the SiGe-based capping layer creates a Ge-doped layer in a top surface of the isolation features. The method further includes sequentially removing the Si-based and the SiGe-based capping layers, thereby removing the Ge-doped layer to form a recess in the isolation features. In the present embodiments, the recess exposes portions of the sidewalls surfaces of the semiconductor fin, which subsequently engages with the metal gate stack in a sub-channel region (i.e., a region below the stack of semiconductor channel layers) of the GAA FET. Although not intended to be limiting, one or more embodiments of the present disclosure provide many benefits to a semiconductor device and the formation thereof. For example, the semiconductor structure provided herein removes the isolation features (containing insulating material such as silicon oxide) disposed between the metal gate stack and the portion of the semiconductor fin in the sub-channel region, thereby allowing the metal gate stack to better engage with the semiconductor fin for improved short-channel control, reduction in leakage current, and/or reduction in capacitance for improved RC speed. Embodiments of the disclosed methods can be readily integrated into existing processes and technologies for manufacturing GAA FETs.

In one aspect, the present embodiments provide a method that includes forming semiconductor fins over a substrate, where each semiconductor fin includes a stack of alternating SiGe layers and Si layers disposed over a protruding portion of the substrate, forming isolation features including silicon oxide over the substrate, thereby separating bottom portions of the semiconductor fins, and depositing a capping layer including SiGe over the semiconductor fins, where Ge in the capping layer diffuses into the isolation features to form a Ge-doped layer in the isolation features. The method further includes performing a first etching process to remove the capping layer and portions of the Ge-doped layer, performing a second etching process to remove the SiGe layers and remaining portions of the Ge-doped layer, thereby forming openings between the Si layers and exposing sidewalls of the protruding portion of the substrate, and forming a metal gate stack in the openings and over the semiconductor fins, such that the metal gate stack extends to directly contact the sidewalls of the protruding portion of the substrate.

In another aspect, the present embodiments provide a method that includes forming a semiconductor structure having a fin protruding from a substrate and isolation structures over the substrate, where the fin includes a stack of alternating channel layers and SiGe non-channel layers disposed over a base fin and the isolation structures includes Si and O, forming a SiGe capping layer over the semiconductor structure, thereby forming a Ge—Si—O-containing (GeSiO) region in the isolation structures, forming and oxidizing a Si capping layer over the SiGe capping layer, forming a placeholder gate over the oxidized Si capping layer, removing the oxidized Si capping layer, thereby removing the SiGe capping layer and portions of the GeSiO region to form a recess in the isolation structures, and replacing the placeholder gate and the non-channel layers with a metal gate stack, such that a bottom portion of the metal gate stack wrap around a top portion of the base fin.

In yet another aspect, the present embodiments provide a semiconductor structure that includes a stack of semiconductor layers disposed over a protruding portion of a substrate, isolation features disposed over the substrate, wherein a top surface of the protruding portion of the substrate is separated from a bottom surface of the isolation features by a first distance, a metal gate stack interleaved with the stack of semiconductor layers, where a bottom portion of the metal gate stack is disposed on sidewalls of the protruding portion of the substrate and where thickness of the bottom portion of the metal gate stack is defined by a second distance that is less than the first distance, and epitaxial source/drain features disposed adjacent to the metal gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming semiconductor fins over a substrate, wherein each semiconductor fin includes a stack of alternating SiGe layers and Si layers disposed over a protruding portion of the substrate;
   forming isolation features including silicon oxide over the substrate, thereby separating bottom portions of the semiconductor fins from each other;
   depositing a capping layer including SiGe over the semiconductor fins, wherein Ge in the capping layer diffuses into the isolation features to form a Ge-doped layer in the isolation features;
   performing a first etching process to remove remaining portions of the capping layer and portions of the Ge-doped layer;
   performing a second etching process to remove the SiGe layers and remaining portions of the Ge-doped layer, thereby forming openings between the Si layers and exposing sidewalls of the protruding portion of the substrate; and
   forming a metal gate stack in the openings and over the semiconductor fins, such that the metal gate stack extends to directly contact the sidewalls of the protruding portion of the substrate.

2. The method of claim 1, wherein the capping layer is a first capping layer, the method further comprising:
   depositing a second capping layer over the first capping layer, wherein the second capping layer includes Si but is free of Ge;
   oxidizing the second capping layer to form silicon oxide; and
   performing the first etching process to remove the oxidized second capping layer.

3. The method of claim 2, wherein oxidizing the second capping layer includes forming a silicon oxide layer over the second capping layer by a deposition process, by an oxidation process, or a combination thereof.

4. The method of claim 2, wherein oxidizing the second capping layer oxidizes portions of the first capping layer to form silicon oxide, and wherein performing the first etching process removes the oxidized portions of the first capping layer.

5. The method of claim 1, wherein the diffusing of Ge results in concentration of Ge in the Ge-doped layer to decrease away from the sidewalls of the protruding portion of the substrate.

6. The method of claim 1, wherein the Ge-doped layer includes a combination of silicon oxide and Ge, wherein performing the first etching process removes silicon oxide at a higher rate than Ge, and wherein performing the second etching process removes SiGe at a higher rate than silicon oxide.

7. The method of claim 1, wherein concentration of Ge in the capping layer is at least about 40%.

8. A method, comprising:
   forming a semiconductor structure that includes:
      a fin protruding from a substrate, the fin including a stack of alternating channel layers and non-channel layers disposed over a base fin, wherein the non-channel layers include SiGe; and
      isolation structures over the substrate and surrounding the base fin, wherein the isolation structures include Si and O;
   forming a SiGe capping layer over the semiconductor structure, thereby forming a Ge—Si—O-containing (GeSiO) region in the isolation structures;
   forming a Si capping layer over the SiGe capping layer;
   oxidizing the Si capping layer;
   forming a placeholder gate over the oxidized Si capping layer;
   removing the oxidized Si capping layer, thereby removing the SiGe capping layer and portions of the GeSiO region to form a recess in the isolation structures; and
   replacing the placeholder gate and the non-channel layers with a metal gate stack, such that a bottom portion of the metal gate stack wrap around a top portion of the base fin.

9. The method of claim 8, wherein oxidizing the Si capping layer includes forming a silicon oxide layer over the Si capping layer, and wherein removing the silicon oxide layer removes the oxidized Si capping layer.

10. The method of claim 8, wherein oxidizing the Si capping layer oxidizes portions of the SiGe capping layer, such that removing the oxidized Si capping layer removes the oxidized portions of the SiGe capping layer.

11. The method of claim 8, wherein forming the SiGe capping layer causes Ge to diffuse into the isolation structures, thereby forming the GeSiO region.

12. The method of claim 11, wherein concentration of Ge in sidewall portions of the GeSiO region is higher than that in a middle portion of the GeSiO region, and wherein concentration of Si and O in the middle portion of the GeSiO region is higher than that in the sidewall portions of the GeSiO region.

13. The method of claim 12, wherein removing the oxidized Si capping layer removes the middle portion of the GeSiO region, and wherein removing the non-channel layers removes the sidewall portions of the GeSiO region.

14. The method of claim 8, wherein replacing the placeholder gate and the non-channel layers includes:
    removing the placeholder gate to form a gate trench;
    removing the non-channel layers to form openings between the channel layers, wherein removing the non-channel layers removes remaining portions of the GeSiO region in the recess; and
    forming the metal gate stack in the gate trench and the openings.

15. The method of claim 14, wherein removing the remaining portions of the GeSiO region exposes sidewalls of the base fin, such that forming the metal gate stack results in the bottom portion of the metal gate stack to wrap around the top portion of the base fin.

16. The method of claim 8, wherein concentration of Ge in the SiGe capping layer is about 40% to about 80%.

17. A method, comprising:
    receiving a structure comprising an isolation feature extending between a first fin and a second fin, wherein the first fin comprises a base portion and a vertical stack of alternating channel layers and first sacrificial layers over the base portion;
    forming a capping layer over the structure, thereby converting an upper portion of the isolation feature into a second sacrificial layer, wherein the second sacrificial layer comprises a non-uniform thickness;
    forming a dummy gate structure over the first fin and the isolation feature;
    forming source/drain features coupled to the channel layers of the first fin;
    selectively removing the dummy gate structure and a thinner portion of the second sacrificial layer;
    selectively removing the first sacrificial layers and a thicker portion of the second sacrificial layer; and
    forming a gate stack over and wrapping around the channel layers.

18. The method of claim 17, wherein the isolation feature comprises silicon oxide, and the capping layer comprises a SiGe layer.

19. The method of claim 18, wherein the first sacrificial layers comprise SiGe.

20. The method of claim 17, wherein the second sacrificial layer comprises a concave top surface.

* * * * *